(12) United States Patent
Fukusen et al.

(10) Patent No.: US 7,400,868 B2
(45) Date of Patent: Jul. 15, 2008

(54) AUTOMATIC TUNING APPARATUS FOR FILTER AND COMMUNICATION INSTRUMENT

(75) Inventors: Masaru Fukusen, Otsu (JP); Shuichi Kuroda, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 463 days.

(21) Appl. No.: 11/007,620

(22) Filed: Dec. 8, 2004

(65) Prior Publication Data

US 2005/0148309 A1   Jul. 7, 2005

(30) Foreign Application Priority Data

Jan. 6, 2004   (JP)   ............... 2004-001455

(51) Int. Cl.
    *H04B 1/18*   (2006.01)
(52) U.S. Cl. .............. 455/150.1; 455/175.1; 455/154.1; 455/178.1; 333/17.1; 333/17.3; 333/174
(58) Field of Classification Search .............. 455/150.1, 455/173.1, 178.1, 180.3, 182.1–182.3, 191.1, 455/192.1–192.3, 193.1, 193.2, 213, 306, 455/307; 333/17.1, 17.3, 174
See application file for complete search history.

(56) References Cited

U.S. PATENT DOCUMENTS 4,127,819 A * 11/1978 Keane ..................... 455/192.1
4,395,779 A * 7/1983 Fujino et al. ................ 455/306
4,539,566 A * 9/1985 Sharpe et al. ............... 342/389
5,179,727 A * 1/1993 Imagawa ................. 455/182.3
5,369,793 A * 11/1994 Vincent ...................... 455/306
5,438,304 A * 8/1995 Jennings .................... 333/17.1
5,499,396 A * 3/1996 Reime ........................ 455/266
6,058,148 A * 5/2000 Whikehart et al. .......... 375/350
6,122,496 A * 9/2000 Yoshioka .................... 455/307
6,178,314 B1 * 1/2001 Whikehart et al. ........ 455/188.1
6,307,443 B1 * 10/2001 Gabara ...................... 333/17.1
6,983,136 B2 * 1/2006 Mason et al. ............... 455/307
2004/0246056 A1 * 12/2004 Behzad et al. .............. 330/311

FOREIGN PATENT DOCUMENTS

JP       09083294 A  *  3/1997

* cited by examiner

*Primary Examiner*—Edward Urban
*Assistant Examiner*—Junpeng Chen
(74) *Attorney, Agent, or Firm*—Panitch Schwarze Belisario & Nadel LLP

(57) ABSTRACT

An automatic tuning apparatus for a filter includes a mode wherein a switching part is controlled so that a reference signal is inputted to the filter, a plural number of control signals are successively input to a control terminal of the filter, a tentative value of the control signal is determined based on respective amplitudes detected by an amplitude detection part as a "coarse tuning step", a plural number of control signals are successively input in the vicinity of the tentatively determined value to a control terminal, and the value of the control signal is determined to be used in a mode as a "fine tuning step" based on respective phase differences detected by a phase comparator part".

13 Claims, 15 Drawing Sheets

FIG. 6

| COUNTER VALUE | | AMPLITUDE JUDGMENT |
|---|---|---|
| 0 0 | 0 0 0 0 | L |
| 0 1 | 0 0 0 0 | H |
| 1 0 | 0 0 0 0 | L |
| 1 1 | 0 0 0 0 | L |

F I G. 9

| COUNTER VALUE | | PHASE COMPARISON RESULT |
|---|---|---|
| 0 1 | 0 0 0 0 | FILTER < TARGET FREQUENCY F0 |
| 0 1 | 1 0 0 0 | TARGET FREQUENCY F0 < FILTER |
| 0 1 | 0 1 0 0 | FILTER < TARGET FREQUENCY F0 |
| 0 1 | 0 1 1 0 | TARGET FREQUENCY F0 < FILTER |
| 0 1 | 0 1 0 1 | TARGET FREQUENCY F0 < FILTER |
| 0 1 | 0 1 0 0 | (FINAL RESULT) |

FIG. 11

| COUNTER VALUE | | PHASE COMPARISON RESULT |
|---|---|---|
| 0 1 | 0 0 0 0 | TARGET FREQUENCY F0 < FILTER |
| 0 0 | 1 0 0 0 | FILTER < TARGET FREQUENCY F0 |
| 0 0 | 1 1 0 0 | FILTER < TARGET FREQUENCY F0 |
| 0 0 | 1 1 1 0 | TARGET FREQUENCY F0 < FILTER |
| 0 0 | 1 1 0 1 | TARGET FREQUENCY F0 < FILTER |
| 0 0 | 1 1 0 0 | (FINAL RESULT) |

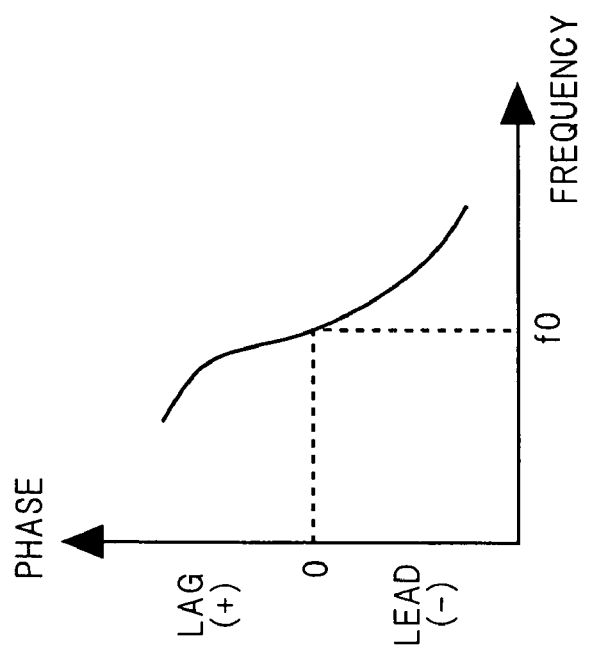
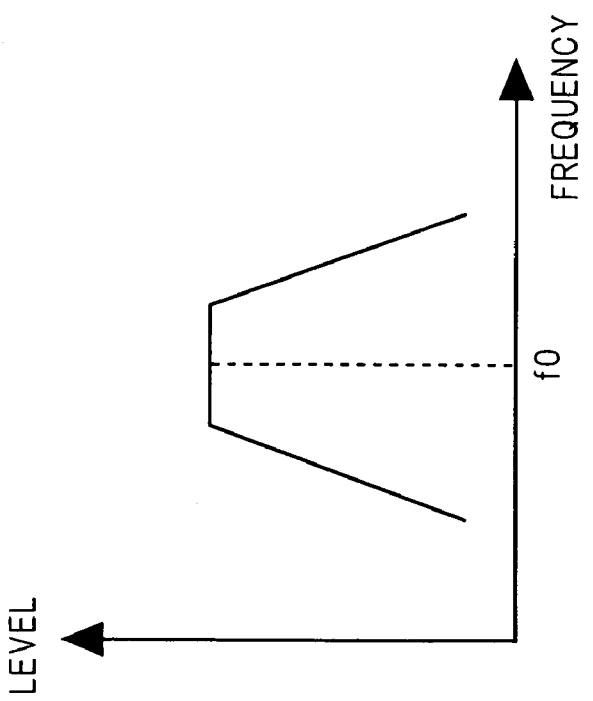
FIG. 15

AUTOMATIC TUNING APPARATUS FOR FILTER AND COMMUNICATION INSTRUMENT

BACKGROUND OF THE INVENTION

The present invention relates to an automatic tuning apparatus for filter for tuning the characteristic frequency of a filter having a tuning function to a target frequency and a communication instrument including the above. The present invention relates particularly to an automatic tuning apparatus for filter with low electric power consumption performing high-speed automatic tuning and a communication instrument including the above.

For the recent communication instrument (for example, mobile phones), efforts have been devoted on lowering the power consumption, weight saving and small sizing. On various electronic components, it is a general tendency that they are formed as an integrated circuit. On the filters, too, there is a similar tendency. In the past, they were discrete elements outside the integrated circuit. It is often the case that they are now included as gm-C filters in the integrated circuit. Here, the gm-C filter is a filter utilizing a transconductor (gm) and a capacitor (C) within it so that its frequency response can be changed and controlled by voltage or by current.

For example, for mobile phone, a narrow band BPF having about 5 percent band width with respect to its center frequency is needed. It is required to realize a filter having a center frequency of about 0.2 to 0.3 percent accuracy with respect to the target designed value.

In general, dispersions in the manufacturing process of the integrated circuit are ±10-odd percent for resistors, and also ±10-odd percent for capacitors. The characteristic frequency of a filter composed of a resistor and a capacitor produces dispersions of equal to or more than ±20 percent. A gm-C filter included in a communication instrument is constructed to be tunable from outside and tuned in high accuracy at factory.

The characteristic frequency for a band path filter (BPF) means the center frequency f0. For high pass filter (HPF) and low pass filter (LPF), it means cut-off frequency (frequency at the −3 dB point).

In a mobile phone having a gm-C filter within it, if the consumption current of the gm-C filter is large, duration of call of the mobile phone allowed by each battery charge becomes short. If making the battery size large for securing a longer duration of call, weight saving and small sizing of the mobile phone are not realized.

Under such condition, a gm-C filter is required to have as small power consumption as possible. Also, since the tuning time of the gm-C filter influences power consumption, it is important to attempt to lower the power consumption by shortening the tuning time.

A method for tuning the gm-C filter of a first prior art is disclosed in the Japanese Patent Publication No. Hei 9-83294. Method for tuning a gm-C filter of the first prior art is such that, inputting a reference signal to the gm-C filter, by observing the phase difference between the input signal to the filter and the output signal from it, tuning of the filter is processed.

In the gm-C filter (BPF) of the first prior art, the reference signal having a frequency identical to the tuning target value of the center frequency of the filter is inputted. In this case, when the characteristic frequency of the filter coincides with the target frequency, phase difference between filter output signal and filter input signal becomes 0.

If the characteristic frequency of the filter is higher than the target frequency, the phase of the filter output signal lags behind the phase of the input signal. If the characteristic frequency of the filter is lower than the target frequency, the phase of the filter output signal leads ahead the phase of the input signal. To utilize this principle, inputting the reference signal into the filter, the phase difference between the filter output signal and the reference signal is detected.

In the above-mentioned prior art, based on the above-mentioned result, a value of the updown counter is changed. The updown counter outputs its counter value as the control signal to control the filter. The gm-C filter is tuned appropriately according to the counter value.

In the tuning method of the gm-C filter of the first prior art, inputting the reference signal to the filter, the phase of the filter output signal and the phase of the reference signal are compared. The tuning method of the gm-C filter of the first prior art was that, upon the result of the above, judging is made whether the characteristic frequency of the filter is higher or lower than the target value, and then based on the above-mentioned result the tuning of the filter was achieved.

However, when, for example, the dispersion due to the manufacturing process is large, such case that the center frequency (characteristic frequency) of BPF deviates largely from the target value can happen. If the tuning of such BPF is attempted, because of this large deviation of the center frequency of the filter from the frequency of the reference signal, the reference signal is attenuated largely in the filter, and the amplitude of the filter output signal becomes very small. Therefore, the phase comparison between the filter output signal and the reference signal becomes difficult.

When Q value of the BPF is high, even because of a slight deviation of the characteristic frequency from the frequency of the reference signal, the reference signal is attenuated largely in the filter. Therefore, the amplitude of the filter output signal becomes very small.

When applying this method to a 4th order BPF, when the characteristic frequency deviates more than a certain amount to lower-frequency side, the phase of the filter output signal leads as much as 180° or more (delayed phase between 0°-180°) from the target phase value. When the characteristic frequency of the filter deviates more than a certain amount to higher-frequency side, the phase of the filter output signal lags as much as 180° or more (leading phase between 0°-180°) from the target phase value.

Therefore, when comparing the phase of the filter output signal and the phase of the reference signal, it can not be judged that the characteristic frequency deviates to lower frequency side than the target frequency based on the fact that the phase of the filter output signal leads ahead from the target phase value (leading phase between 0°-180°).

The Japanese Patent Publication No. Hei 9-130206 discloses an automatic tuning apparatus for filter of a second prior art having variable Q value of a filter when tuning the filter by the phase comparison. In the automatic tuning apparatus for filter of the second prior art, detecting the level of the filter output signal, and based on this detected result, gain of the signal to be inputted to the filter is controlled. This automatic tuning apparatus for filter is for attempting to tune a filter by carrying out the phase comparison stably even when the Q value of the filter is high.

In the automatic tuning apparatus for filter of the second prior art, the output level of the band filter is detected and the input level of the band filter is changed appropriately. The method performs the filter tuning stably.

In the second prior art, a feedback circuit is newly provided in order to set the band filter input level appropriately.

Thereby, in comparison with automatic tuning apparatus for filter of other prior arts, the characteristic frequency tuning apparatus of the second prior art requires longer time for the filter tuning as the feedback circuit requires the time for setting the band filter input level appropriately, This art further provides a band pass filter for the tuning monitor use in addition to the active filter to be used actually, and the characteristic frequency of this band pass filter is tuned to the target value.

A relative error can exist between the active filter to be used actually and the band pass filter for the tuning monitor use. Therefore, even if the tunings made appropriately by the band filter, there will be a fear that the active filter to be used actually is not tuned accurately.

The present invention purposes to offer an automatic tuning apparatus for filter of small size and power saving type which enables an accurate tuning, and a communication instrument including the above.

The present invention purposes to offer an automatic tuning apparatus for filter which can tune the characteristic frequency of the filter appropriately even for a higher-order filter or a high-Q filter, as well as, to offer a communication instrument including the above.

The present invention purposes to offer an automatic tuning apparatus for filter of low power consumption and performing a high-speed tuning of the filter, and a communication instrument including the above.

The present invention purposes to offer an automatic tuning apparatus for filter with low possibility of erroneous tuning of the filter, and a communication instrument including the above.

BRIEF SUMMARY OF THE INVENTION

To solve the above-mentioned problem, the present invention has the following composition.

The automatic tuning apparatus for filter according to one aspect of the present invention comprises: an input terminal to which an input signal is inputted; a reference signal generator for outputting a reference signal; a first switching part wherethrough the above-mentioned input signal and the above-mentioned reference signal are inputted and wherefrom either one of them is selectively outputted; a filter having a control terminal wherethrough a control signal for controlling its filter characteristic is inputted, signal outputted from the above-mentioned switching part with the above-mentioned filter characteristic and outputs the processed signal; an output terminal from which the output signal of the above-mentioned filter is outputted; an amplitude detection part whereto the above-mentioned output signal of the above-mentioned filter is inputted and detects its amplitude; a phase comparator part for detecting the phase difference between the signal before its passing through the above-mentioned filter and the signal after its passing through the above-mentioned filter; and a control part for determining a value of the above-mentioned control signal.

The above-mentioned control part controls the above-mentioned first switching part such that in a first mode the above-mentioned input signal is inputted to the above-mentioned filter and outputted from the above-mentioned output terminal.

The above-mentioned control part in a second mode (1) controls the above-mentioned first switching part so that the above-mentioned reference signal is inputted to the above-mentioned filter; and (2) inputs successively a plural number of control signals to the above-mentioned control terminal of the above-mentioned filter, thereby to determine the value of the above-mentioned control signal to be used in the above-mentioned first mode, based on respective amplitudes detected by the above-mentioned amplitude detection part and respective phase differences detected by the above-mentioned phase comparator part.

In this invention, coarse tuning of the filter is processed so that the amplitude level of the filter output signal becomes a specified value (typically the maximum value) using the amplitude detection part. Next, under the condition that the characteristic frequency f0 of the filter approximately coincides with the target frequency, it was attempted to perform the fine tuning by the phase comparison.

Even for filters of higher order or filters having high Q value, characteristic frequency f0 of the filter can be tuned appropriately. The filter used for such tuning is the filter to be used actually.

In this invention, since no separate filter only for the tuning purpose is used, accurate tuning is possible.

This invention can realize an automatic tuning apparatus for filter of small size, weight saving and low power consumption.

Typically, frequency of the reference signal is a target frequency. If the filter is BPF, the control signal with which the amplitude of the filter output signal becomes a maximum value or a minimal value is typically an appropriate control signal. The target value of the phase difference depends on such as the order number of the filter.

In the above-mentioned automatic tuning apparatus for filter according to another aspect of the invention, in the above-mentioned second mode, the above-mentioned control part: (1) controls the above-mentioned first switching part so that the above-mentioned reference signal is inputted to the above-mentioned filter; (2) inputs successively a plural number of control signals to the above-mentioned control terminal of the above-mentioned filter; (3) determines tentatively the value of the control signal based on respective amplitudes detected by the above-mentioned amplitude detection part (hereinafter, called as "coarse tuning step"); (4) inputs successively a plural number of control signals in the vicinity of the tentatively determined value to the above-mentioned control terminal; and (5) determines the value of the control signal to be used in the above-mentioned first mode based on respective phase differences detected by the above-mentioned phase comparator part (hereinafter, referred to as "fine tuning step").

In this invention, at first, the coarse tuning of the filter is processed based on the amplitude. After that, the fine tuning of the filter is processed based on the phase difference.

This invention can realize a high-speed tuning of the filter. This invention can realize the lowering of power consumption of the automatic filter tuning circuit.

In the above-mentioned automatic tuning apparatus for filter according to another aspect of the invention, the above-mentioned filter is a gm-C filter having a plural number of transconductance amplifiers and a plural number of capacitors. In at least one of the above-mentioned transconductance amplifiers, its conductance gm is controlled by the above-mentioned control signal.

According to this invention, it is easy to form the automatic tuning apparatus for filter in an integrated circuit. According to this invention, by controlling the conductance gm, it becomes possible to make the characteristic frequency of the filter coincide with the target frequency.

In the above-mentioned automatic tuning apparatus for filter according to still another aspect of the invention, in the above-mentioned second mode, the above-mentioned control part: (1) repeats the above-mentioned coarse tuning step a plurality of times; (2) makes a mode (most frequently appearing value), a median (center value), or an average value obtained from a plural number of repeated results to be the above-mentioned value of the control signal tentatively determined; and/or (3) repeats the above-mentioned fine tuning steps a plurality of times and makes a mode, a median, or an average value obtained from a plural number of repeated results to be the above-mentioned value of the control signal.

According to this invention, influence of a large disturbance added accidentally can be prevented. This invention can prevent incorrect tuning.

In the above-mentioned automatic tuning apparatus for filter according to still another aspect of the invention, the above-mentioned control part has an updown counter of plural number of bits. The above-mentioned control part: (1) inputs a counter value of the updown counter as the control signal into the above-mentioned control terminal of the above-mentioned filter. The characteristic frequency of the above-mentioned filter changes to a definite direction as the above-mentioned counter value increases; (2) executes the above-mentioned coarse tuning step by means of changing predetermined number of higher significant bits of the counter value of the above-mentioned updown counter; and (3) inputs a plural number of counter values which start from a value in the vicinity of the counter value tentatively determined in the above-mentioned coarse tuning step as the control signal into the above-mentioned control terminal, thereby to execute the above-mentioned fine tuning step.

According to this invention, by using an updown counter, the filter can be tuned in high speed by a circuit of a small scale and low power consumption in comparison with, for example, a configuration using a microcomputer.

The above-mentioned automatic tuning apparatus for filter according to still another aspect of the invention has a first binarizer for receiving the above-mentioned reference signal in a state before it is inputted into the above-mentioned filter and converting it into a binarized reference signal of duty factor of about 50 percent and then sending it to the above-mentioned phase comparator part; and further has a second binarizer for receiving the output signal of the above-mentioned filter and converting it into a binarized output signal and then sending it to the above-mentioned phase comparator part.

In the above-mentioned fine tuning step, first, the above-mentioned phase comparator part detects the phase difference between the above-mentioned binarized reference signal and the above-mentioned binarized output signal. Next, the above-mentioned control part raises or lowers the counter value of the above-mentioned updown counter according to the above-mentioned phase difference.

According to this invention, with a simple composition, it is possible to change the control signal to be inputted to the filter responding to the phase difference.

In the automatic tuning apparatus for filter according to still another aspect of the present invention, the above-mentioned control part: in the above-mentioned coarse tuning step, (1) judges whether the amplitude variation characteristic having a plural number of counter values as its parameter is permissible or not; and (2) when judged that it is not permissible, the above-mentioned control part executes the above-mentioned coarse tuning step again, or it outputs error information thereby to stop the tuning of the filter.

For example in the coarse tuning step, if an amplitude vibration characteristic having two maximum values was obtained, possibility of incorrect measurement is high. When such a non-permissible variation characteristic was obtained, by canceling its measured values, incorrect tuning of the filter can be prevented.

The automatic tuning apparatus for filter according to still another aspect of the invention: (1) starts the above-mentioned coarse tuning step taking a certain value in the vicinity of a presently stored counter value as an initial value; or the automatic tuning apparatus for filter: starts the above-mentioned coarse tuning step taking a certain value in the vicinity of a counter value derived from the presently stored counter value as an initial value based on a specified parameter value at the time when the presently stored counter value was stored as well as on the parameter value at the present; and the automatic tuning apparatus for filter (2) terminates the above-mentioned coarse tuning step at the time when a permissible amplitude variation characteristic including maximum or minimum point or range was obtained.

By this method, further higher speed tuning is possible.

In the above-mentioned automatic tuning apparatus for filter according to still another aspect of the invention: (1) after the above-mentioned fine tuning, the above-mentioned control part adds and/or subtracts a specified number of bits to and/or from the determined counter value and then inputs the obtained counter value to the above-mentioned control terminal; (2) the above-mentioned phase comparator part detects the phase difference (hereinafter, called as "confirmation step"); and (3) when the phase difference obtained by the above-mentioned confirmation step is permitted, the above-mentioned control part maintains the above-mentioned determined counter value. When the phase difference is not permitted, the above-mentioned control part cancels the above-mentioned determined counter value.

According to this invention, incorrect tuning of the filter can be prevented.

In the above-mentioned automatic tuning apparatus for filter according to still another aspect of the invention, the above-mentioned filter has a Q-value control terminal wherethrough the Q-value is changed further. The above-mentioned control part: (1) in the above-mentioned second mode, raises the Q-value by controlling the input signal to the above-mentioned Q-value control terminal; (2) inputs a plural number of control signals successively to the above-mentioned control terminal of the above-mentioned filter; and (3) determines a value of the control signal to be used in the above-mentioned first mode based on respective amplitudes detected by the above-mentioned amplitude detection part and respective phase differences detected by the above-mentioned phase comparator part.

According to this invention, the filter can be tuned in further higher accuracy. For example, it is also possible to perform the amplitude detection in keeping the Q-value of the filter low and then to perform the phase detection in keeping the Q-value of the filter high.

In the above-mentioned automatic tuning apparatus for filter according to still another aspect of the invention, in the case that the tuning of the above-mentioned filter is executed newly, the above-mentioned control part, based on the value of the control signal determined in a preceding tuning of the filter, determines a plural number of new values of the control signals. These control signals of new values are inputted to the above-mentioned control terminal at the above-mentioned coarse tuning step, or at the above-mentioned coarse tuning step and the above-mentioned fine tuning step.

Between the value of the control signal determined at the preceding filter tuning (the value of the control signal in the present first mode) and the value of the control signal determined at the present filter tuning, possibility that they are identical or close to each other is high. By changing the control signal in the vicinity of the value of the control signal determined at the preceding filter tuning, the coarse tuning can be carried out efficiently.

In the above-mentioned automatic tuning apparatus for filter according to still another aspect of the invention: (1) when a difference between the counter value determined by the above-mentioned preceding filter tuning (hereinafter called as "preceding counter value") and the counter value determined by the above-mentioned filter tuning newly executed (hereinafter called as "newly obtained counter value") is larger than a specified threshold value, the above-mentioned control part cancels the newly obtained counter value; and (2) executes the tuning of the filter again and uses the preceding counter value without any modification in the above-mentioned first mode.

According to this invention, incorrect tuning of the filter can be prevented.

A communication instrument according to one aspect of the invention has an automatic tuning apparatus for filter according to either one described above in its receiver part. When it executes communication, the above-mentioned automatic tuning apparatus for filter executes the above-mentioned first mode. When it does not execute communication, the above-mentioned automatic tuning apparatus for filter executes the above-mentioned second mode at the specified timing.

For example, communication instrument such as mobile phone has a highly stable oscillator and filters of a characteristic frequency which is corresponding to the oscillation frequency of the oscillator (for transmitter and/or receiver use).

A communication instrument of this invention performs communication using an oscillator and filters of the first mode.

In this invention, in the second mode that is settled in a resting period of communication, the filter is automatically tuned using the output signal of a highly stable oscillator as the reference signal. As a result, a highly stable communication instrument can be realized.

The above-mentioned communication instrument according to another aspect of the invention is a mobile phone or a communication instrument at its base station.

This invention realizes a mobile phone having a high stability of small size and low power consumption or a communication instrument at its base station.

According to the present invention, it is possible to obtain an advantageous effect that an automatic tuning apparatus for filter of small size and low power consumption which is capable of executing the automatic filter tuning and a communication instrument including it can be realized.

According to the present invention, for example, even for a filter of higher order or for a filter having a high-Q value, it is possible to obtain an advantageous effect that an automatic tuning apparatus for filter which is capable of tuning the characteristic frequency of the filter appropriately and a communication instrument including it can be realized.

According to the present invention, it is possible to obtain an advantageous effect that an automatic tuning apparatus for filter of low power consumption which is capable of tuning the filter in high speed and a communication instrument including it can be realized.

According to the present invention, it is possible to obtain an advantageous effect that an automatic tuning apparatus for filter by which the possibility of executing an incorrect tuning is low and a communication instrument including it can be realized.

Although the novel features of the invention are none other than that are described in the attached claims, on both of its configuration and contents, the present invention will be better understood and evaluated together with other purposes and features from the following detailed description that is understood in corporation with drawings.

BRIEF DESCRIPTION OF DRAWINGS

FIG. 6 is a drawing showing the counter values and results of the amplitude judgment in the coarse tuning step.

FIG. 9 is a drawing showing the counter values and the results of the phase comparison in the fine tuning step in the filter of FIG. 5.

FIG. 11 is a drawing showing the counter value and the result of the phase comparison in the fine tuning step in the filter of FIG. 10.

FIG. 15 is characteristic curves of the filter of an embodiment of the present invention.

A part or all of the drawings are drawn in a conceptual expression for purposes of illustrative description, and therefore it is requested to take it into account that drawings are not necessarily describing those elements shown there in fidelity to their actual relative sizes or their relative positions.

DETAILED DESCRIPTION OF THE INVENTION

In the following, examples of the present invention are explained referring to drawings.

EMBODIMENTS

Figure 1:
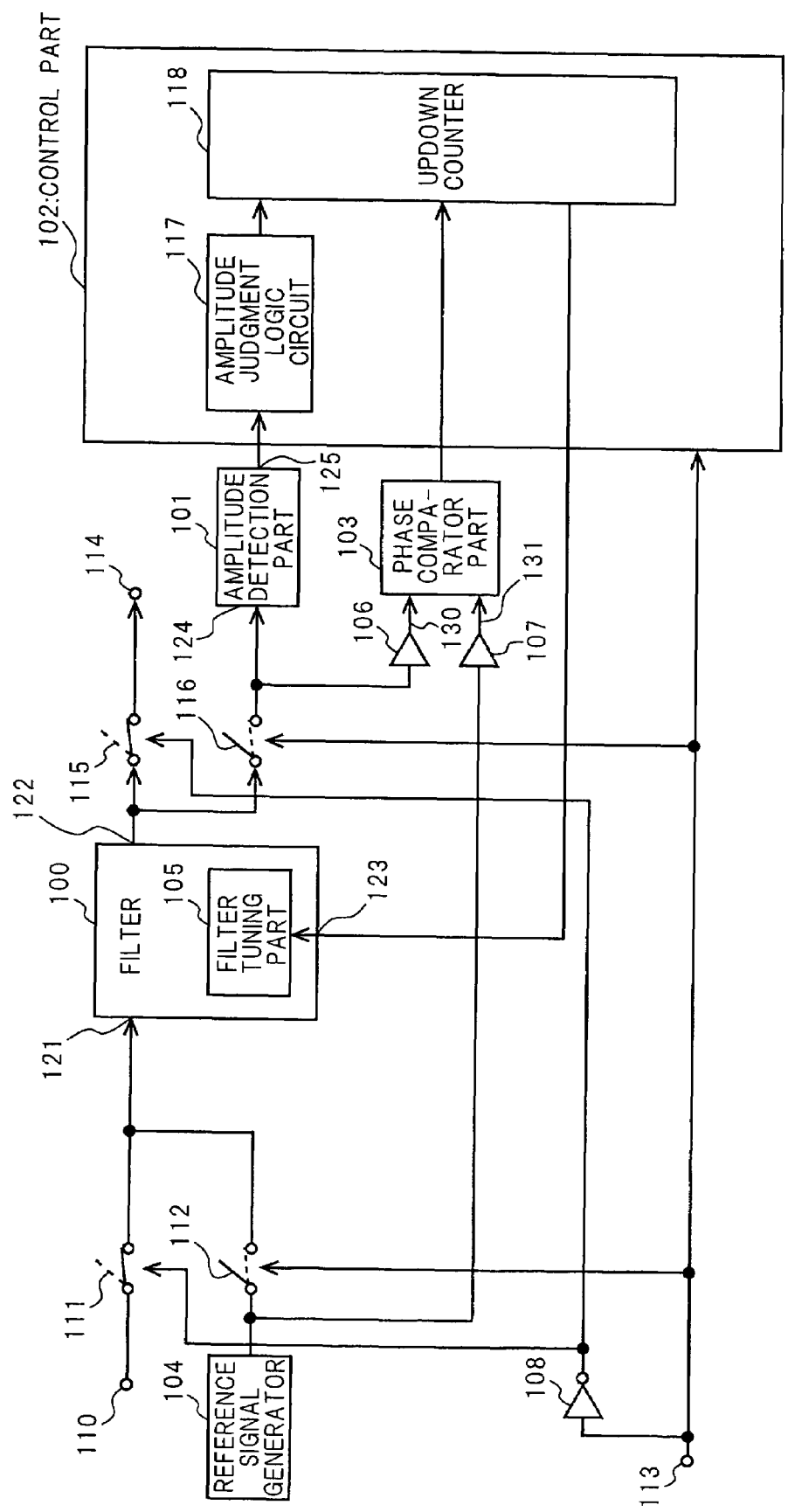
FIG. 1 is a block diagram showing a configuration of an automatic tuning apparatus for filter of an embodiment of the present invention.

Referring to FIG. 1 to FIG. 15, an automatic tuning apparatus for filter of an embodiment and a communication instrument including it are explained. FIG. 1 is a block diagram showing a configuration of an automatic tuning apparatus for filter of the embodiment of the present invention.

The automatic tuning apparatus for filter of the embodiment of the present invention comprises: a gm-C filter 100 which is a tunable narrow band BPF; an amplitude detection part 101 for detecting the amplitude of the reference signal passing through the gm-C filter 100; a control part 102 for inputting the control signal to the gm-C filter 100; a phase comparator part 103 for comparing the phase difference between a binarized filter outputsignal 130 and a binarized reference signal 131; a reference signal generator 104 which generates a reference signal; an amplifier 106 for converting the output signal of the filter 100 into a binarized signal 130; an amplifier 107 for converting the reference signal into a binarized signal 131; an input terminal 110 through which an input signal sent by a base station of mobile phones is inputted; switches 111, 112, 115, 116 which switch on and off between a first mode and a second mode; a mode switching signal input terminal 113 which switches over the first mode and the second mode; and an output terminal 114 through which the signal inputted from the input terminal 110 and passed through the gm-C filter 100 is outputted.

Except for the SAW filter of the reference signal generator 104, the automatic tuning apparatus for filter is integrated in an integrated circuit. The automatic tuning apparatus for filter is included in a receiver part of the mobile phone.

The filter 100 comprises: a filter tuning part 105 for adjusting the filter 100; an input terminal 121 through which the signal inputted through the input terminal 110 or the reference signal outputted from a reference signal generator is inputted; an output terminal 122 through which the signal inputted from the input terminal 121 and passed through the filter 100 is outputted; and the control signal input terminal 123 through which the control signal for controlling the characteristic frequency of the filter 100 is inputted.

The filter 100 of the present invention has an amplitude characteristic shown in FIG. 15(*a*) and a phase characteristic shown in FIG. 15(*b*).

In the filter tuning part 105 of the gm-C filter 100, a 6 bit control signal outputted from the control part 102 is inputted through a control signal input terminal 123. The filter tuning part 105 tunes the filter 100 so that the characteristic frequency (center frequency of the BPF in this embodiment) becomes gradually high as the value of the 6 bit control signal increases from 0 to 111111B (in binary digits).

The automatic tuning apparatus for filter has the first mode in which the filter 100 is used in the ordinary use as well as the second mode which performs the self-tuning on the characteristic frequency of the filter. A mode switching signal outputted from the CPU (not shown) of the mobile phone is inputted through the mode switching signal input terminal 113.

When the mobile phone and the base station are communicating, the automatic tuning apparatus for filter is set to the first mode. The automatic tuning apparatus for filter is set to the second mode in a predetermined timing when not communicating.

The first mode is described. The input terminal 110 receives an input signal. In this embodiment, the input signal is a signal that is sent from the base station and received by the mobile phone. The switch 111 and the switch 115 are conducting. The switches 112 and 116 are shut off.

The input signal inputted from the input terminal 110 passes through the gm-C filter 100, which is a narrow band BPF, and is outputted from the output terminal 114. In the first mode, the reference signal outputted from the reference signal generator 104 is used as the carrier of the signal sent from the mobile phone to the base station.

In the first mode, the control part 102 inputs the control signal which was determined in the second mode into the gm-C filter 100. In the first mode, all the power supplied to the circuit which is used only for the filter tuning in the second mode is cut off. Alternatively, the supply of the system clock is blocked off in the second mode. By this method, the present invention attempts to make the power-saving.

The second mode is described. In the second mode, the switch 111 and the switch 115 are shut off. The switches 112 and 116 are conducting. In the second mode, the control signal tunes the characteristic frequency of the filter. The reference signal which the reference signal generator 104 outputs passes the gm-C filter 100 and is inputted to the amplitude detection part 101 and the amplifier 106.

The amplitude detection part 101 outputs the amplitude judgment result of High if the amplitude of the inputted signal is larger than a predetermined threshold value and outputs the amplitude judgment result of Low if it is not. The amplitude judgment result (in binary digits) of High or Low outputted from the amplitude detection part 101 is inputted to the control part 102.

The control part 102 successively inputs a plural number of the control signals to the control signal input terminal 123 of the filter 100, and detects the value of the control signal at which the amplitude judgment result becomes High.

The high gain amplifier 106 receives the output signal of the filter 100 and converts it into the binarized signal 130 of 50 percent duty factor. The high gain amplifier 107 receives the reference signal and converts it into the binarized signal 131 of 50 percent duty factor.

The phase comparator part 103 receives the binarized output signal (the filter output signal) 130 of the filter 100 and the binarized reference signal 131, and detects the phase difference between those two signals. In this embodiment, when the filter 100 is tuned appropriately, the phase difference between these two signals is 0.

The phase comparator part 103 is a logic circuit. The phase comparator part 103 of the embodiment is a D-type flip-flop. The phase comparator part 103 inputs the binarized filter output signal 130 to the data input terminal, and inputs the binarized reference signal 131 to the clock input terminal.

If the phase of the filter output signal 130 leads ahead the phase of the reference signal 131, the phase comparator part 103 outputs High, whereas if the phase of the filter output signal 130 lags behind the phase of the reference signal 131, the phase comparator part 103 outputs Low.

However, the phase difference between the input signal and the output signal of the filter which was tuned optimally is different according to the characteristics of the filter of such as LPF, BPF, HPF. The phase comparator part 103 has the composition which is different responding to the characteristics of the filters.

The control part 102 inputs successively a plural number of control signals to the control signal input terminal 123 of the filter 100. The control part 102 detects a point at which the amplitude judgment result is High and the binarized signal outputted from the phase comparator part 103 turns from High to Low.

The control part 102 determines the value of the control signal at this point as the value of the control signal to be inputted into the filter 100 in the first mode and record it.

This point is a point at which, in this embodiment, the state of the phase of the filter output signal being advancing ahead the phase of the input signal turns to the state of lagging behind. This point is, as shown in FIG. 15(*b*), a point at which the characteristic frequency of the filter 100 turns from a lower state to a higher state than the target characteristic frequency.

According to the above-mentioned steps, the second mode is terminated. Next, in the secondly arising first mode, the control part 102 inputs the value of the recorded control signal to the control signal input terminal 123 of the filter 100.

The configuration of filter 100 is specifically described.

Figure 2:
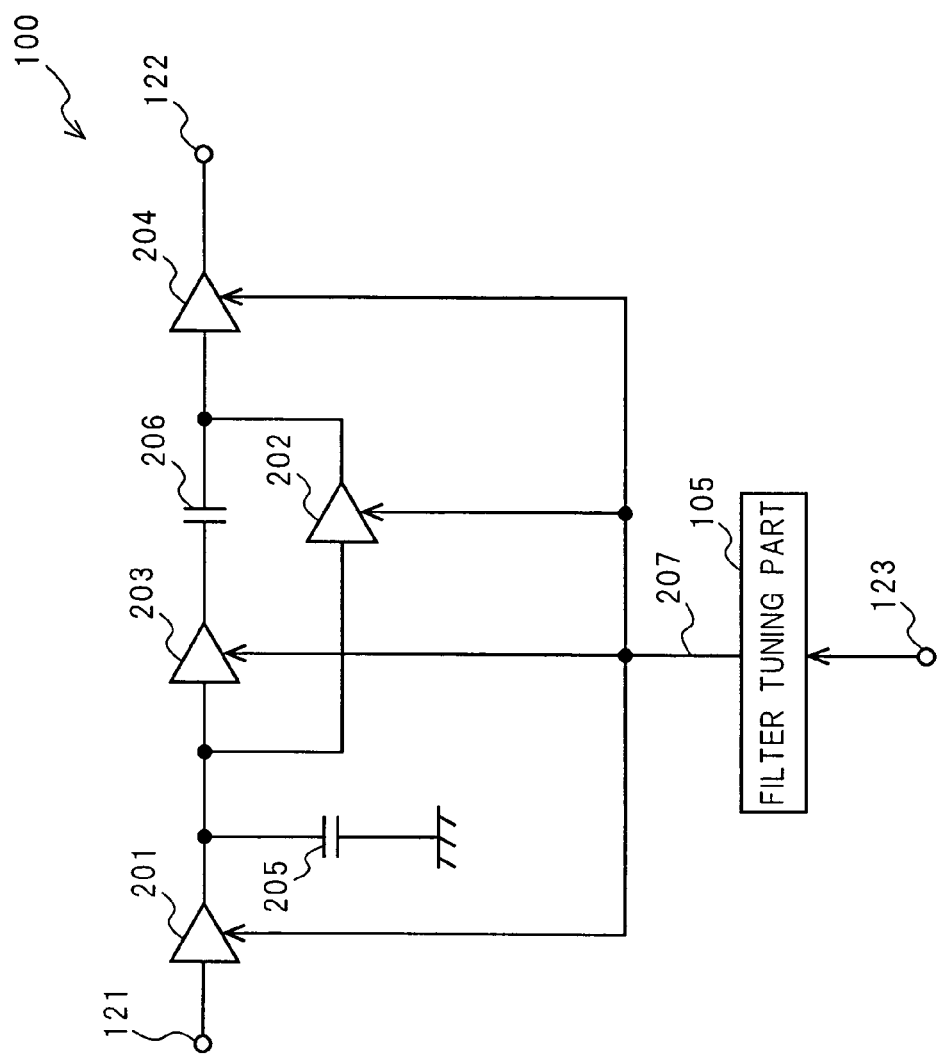
FIG. 2 is a drawing schematically showing a configuration of a filter of an embodiment of the present invention.

FIG. 2 is a drawing showing schematically the configuration of the filter 100 of the embodiment (extremely simplified for the easiness of explanation).

The filter 100 comprises: an input terminal 121 which inputs the signal inputted through the input terminal 110 or the reference signal outputted from the reference signal generator 104; transconductance amplifiers 201, 202, 203, 204; capacitors 205, 206; the filter tuning part 105 for tuning the filter 100; and an output terminal 122 which outputs the signal being inputted from the input terminal 121 and passed through the filter 100.

The conductance gm of the transconductance amplifier 201 and the capacitance C of the capacitor 205 compose an LPF. The conductance gm of the transconductance amplifier 202 and the capacitance C of the capacitor 206 compose an HPF. The filter 100 composes a BPF as a whole. Actually, the filter 100 is a filter of higher order than that shown in FIG. 2 and has a steep filter characteristic.

As the value of the 6 bit control signal which is inputted to the control signal input terminal 123 increases gradually from 0 to 111111B (in binary digits), the filter tuning part 105 increases an electric current 207 to be inputted to each control terminal of the transconductance amplifiers 201 to 204.

As the electric current inputted to the control terminal increases, the electric current which flows through the transconductance amplifiers 201 to 204 increases, or its internal drop voltage declines and the conductance gm increases.

Consequently, the characteristic frequency (the center frequency of BPF in the embodiment) of the filter 100 gradually becomes high. The characteristic frequency of the filter 100 changes in a constant direction as the value of the control signal increases.

Figure 3:
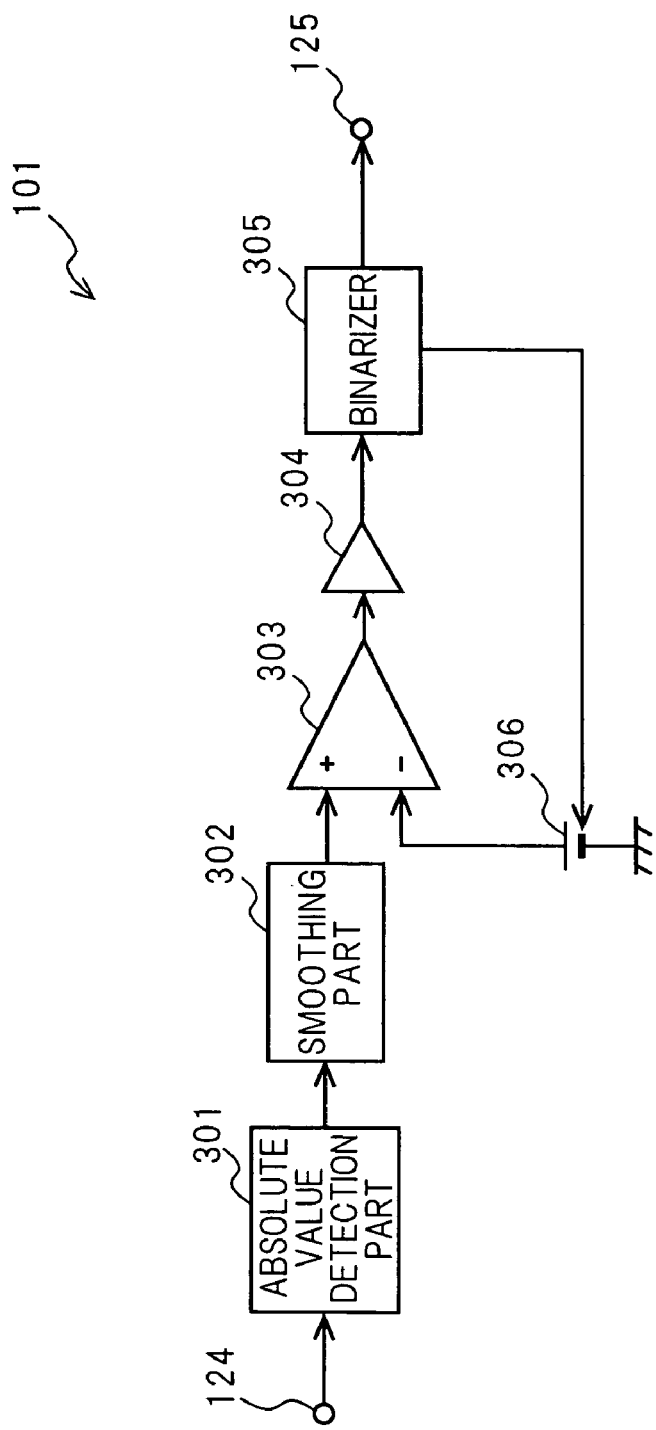
FIG. 3 is a block diagram showing a configuration of an amplitude detection part of an embodiment of the present invention.

The configuration of the amplitude detection part 101 is specifically described. FIG. 3 is the block diagram showing the configuration of the amplitude detection part 101 of the embodiment of the present invention.

The amplitude detection part 101 comprises: an input terminal 124 through which the signal passed through the gm-C filter 100 is inputted; an absolute value detection part 301 for detecting the absolute value of the signal inputted through the input terminal 124; a smoothing part 302 for smoothing the signal detected in the absolute value; a differential amplifier 303 for outputting the differential voltage between an inputted dc voltage and the reference dc voltage; an amplifier 304 for amplifying the inputted differential voltage; a binarizer (logic conversion circuit) 305 for binarizing the differential voltage; a reference dc voltage generation part 306 for outputting a reference dc voltage; and an output terminal 125 which outputs the binarized signal.

The absolute value detection part 301 detects the signal (the output signal of the filter 100) in the absolute value which is inputted to the input terminal 124. The smoothing part 302 smoothes the signal detected in the absolute value using the capacitance. The absolute value detection part 301 and the smoothing part 302 convert the input signal into a dc voltage (called as input dc voltage) corresponding to its amplitude.

The reference dc voltage generation part 306 generates and outputs the dc voltage used as the reference voltage (called as reference dc voltage).

The differential amplifier 303 inputs the input dc voltage and the reference dc voltage and outputs a differential voltage between the input dc voltage and the reference dc voltage.

The high gain amplifier 304 amplifies the differential voltage outputted from the differential amplifier 303.

The binarizer (logic conversion circuit) 305 binarizes the amplified differential voltage outputted from the amplifier 304.

The output terminal 125 outputs the binarized signal.

If the smoothing part 302 has a large capacitance, the output signal of the smoothing part 302 becomes a dc voltage with a small ripple. However, there is a demerit that the transition response of the signal outputted from the smoothing part 302 requires a long period until the transition response is settled down.

In order to speed up the filter tuning process by shortening the inputting time period of each control signal, it is necessary to judge the amplitude of the signal outputted from the smoothing part 302 at an earlier timing after switching over the control signal.

It is necessary to shorten the settling time of the signal outputted from the smoothing part 302. To achieve this, the capacitance of the smoothing part 302 must be made small.

However, when the capacitance is small, the ripple of the output signal of the smoothing part 302 (the input dc voltage) becomes large.

If the differential amplifier 303 inputs the input dc voltage with a large ripple and if the input dc voltage is close to the reference dc voltage, such the phenomenon that the result of the amplitude judgment (the output signal of the amplitude detection part 101) is no settled to either of High or Low, such as High, Low, or High may happen.

When such the signal is inputted to the amplitude judgment logic circuit 117 of the control part 102, the possibility that a signal with an intermediate potential is inputted to the gate of an FET of CMOS structure in the amplitude judgment logic circuit 117 becomes large.

When a signal with an intermediate potential is inputted to the gate of the CMOSFET, since a penetrating current flows through the CMOSFET to the ground from the power source, the problem that the dissipating current of the amplitude judgment logic circuit 117 increases occurs.

To solve this problem, the amplitude detection part 101 has a hysteresis characteristic. The output signal of the binarizer 305 is inputted to the reference dc voltage generation part 306.

When the input dc voltage exceeds the reference dc voltage even in a brief period, the binarizer 305 outputs High. When the signal of High outputted from the binarizer 305 is inputted to the reference dc voltage generation part 306, it lowers slightly the reference dc voltage of its output.

When the input dc voltage becomes lower than the reference dc voltage even in a brief period, the binarizer 305 outputs Low. When the signal of Low outputted from the binarizer 305 is inputted to the reference dc voltage generation part 306, it raises slightly the reference dc voltage of its output.

By the configuration that the amplitude detection part 101 has a hysteresis characteristic, the capacitance of the smoothing part 302 can be made small. The control part 102 can tune the filter 100 in high speed in the second mode.

The configuration of the control part 102 is described specifically. In FIG. 1, the control part 102 has the amplitude judgment logic circuit 117 for judging the amplitude of the input signal and an updown counter 118 for changing a counter value. The updown counter 118 is a 6 bit counter.

The control part 102 inputs the counter value of the updown counter 118 to the control signal input terminal 123 of the filter 100 as the control signal.

The control part 102 changes the counter value of the updown counter 118 in a manner mentioned later in the second mode. The control part 102 inputs successively a plural number of counter values to the filter 100 as the control signal.

In the first mode, the control part 102 inputs the counter value determined according to the outputs of the amplitude judgment logic circuit 117 and the phase comparator part 103 to the filter 100 as the control signal.

Method of the filter tuning in the second mode is explained. In FIG. 1, the switches 111 and 115 are shut off. The switches 112 and 116 are conducting.

Figure 12:
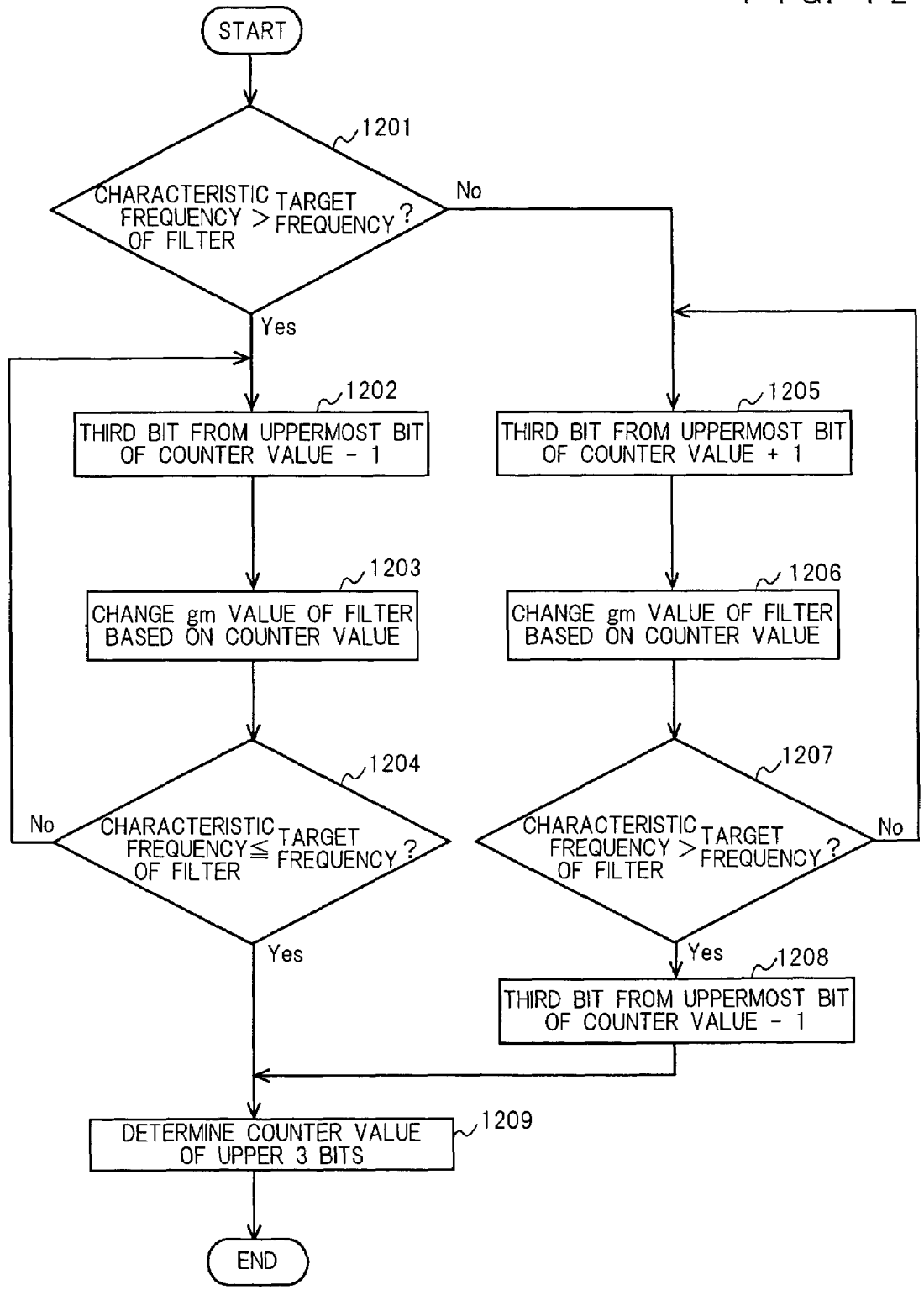
FIG. 12 is a flow chart showing a determination method of the counter value of upper 3 bits in the fine tuning step.
Figure 13:
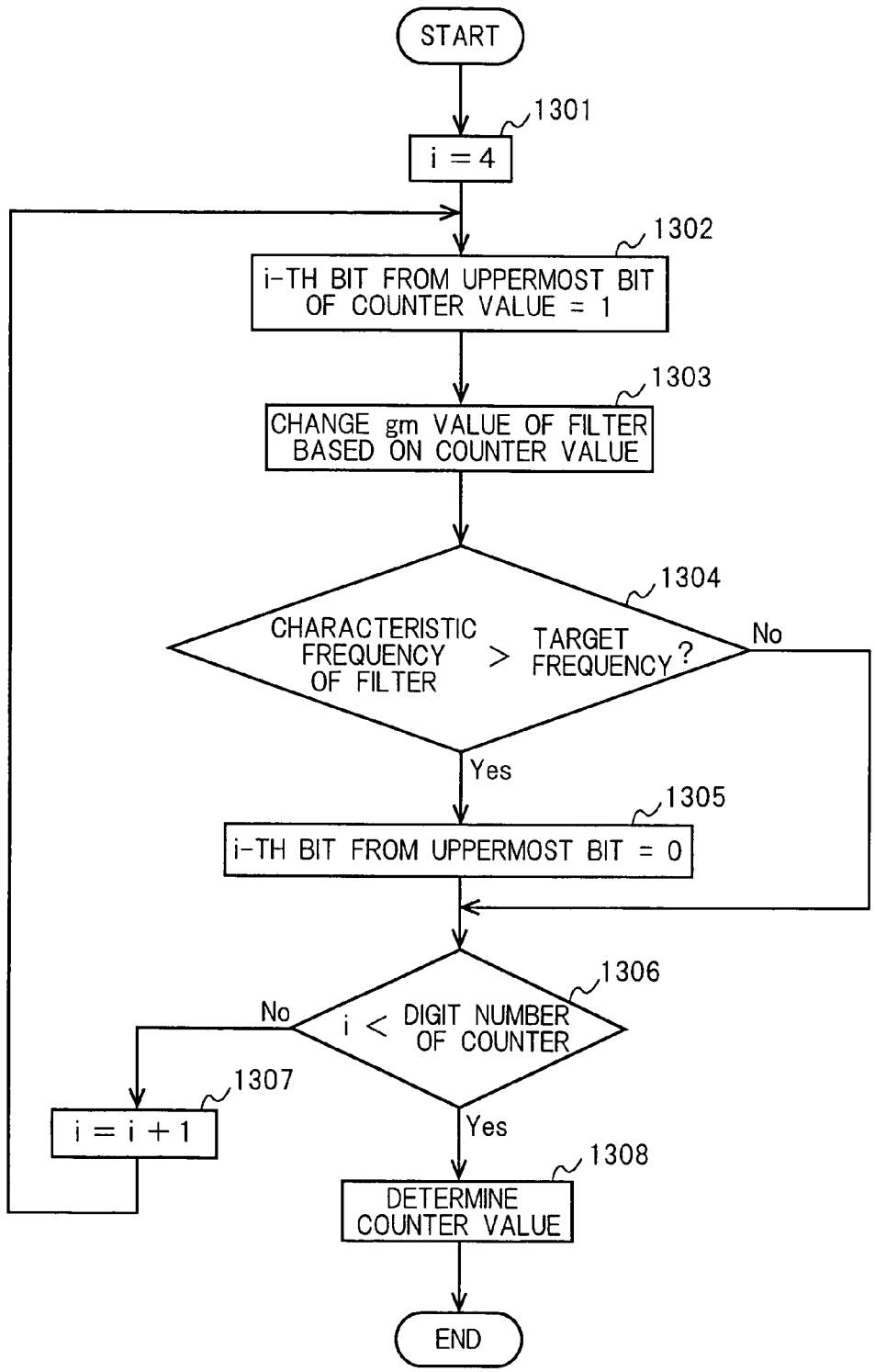
FIG. 13 is a flow chart showing a determination method of the counter value of 4th and after 4th bits from the most significant bit in the fine tuning step.

The control part 102 first executes the coarse tuning step (FIG. 4) of the filter 100 based on the amplitude of the filter output signal. Thereafter the control part 102 executes the fine tuning step (FIG. 12 and FIG. 13). The control part 102 executes the confirmation step (FIG. 14) last.

Figure 4:
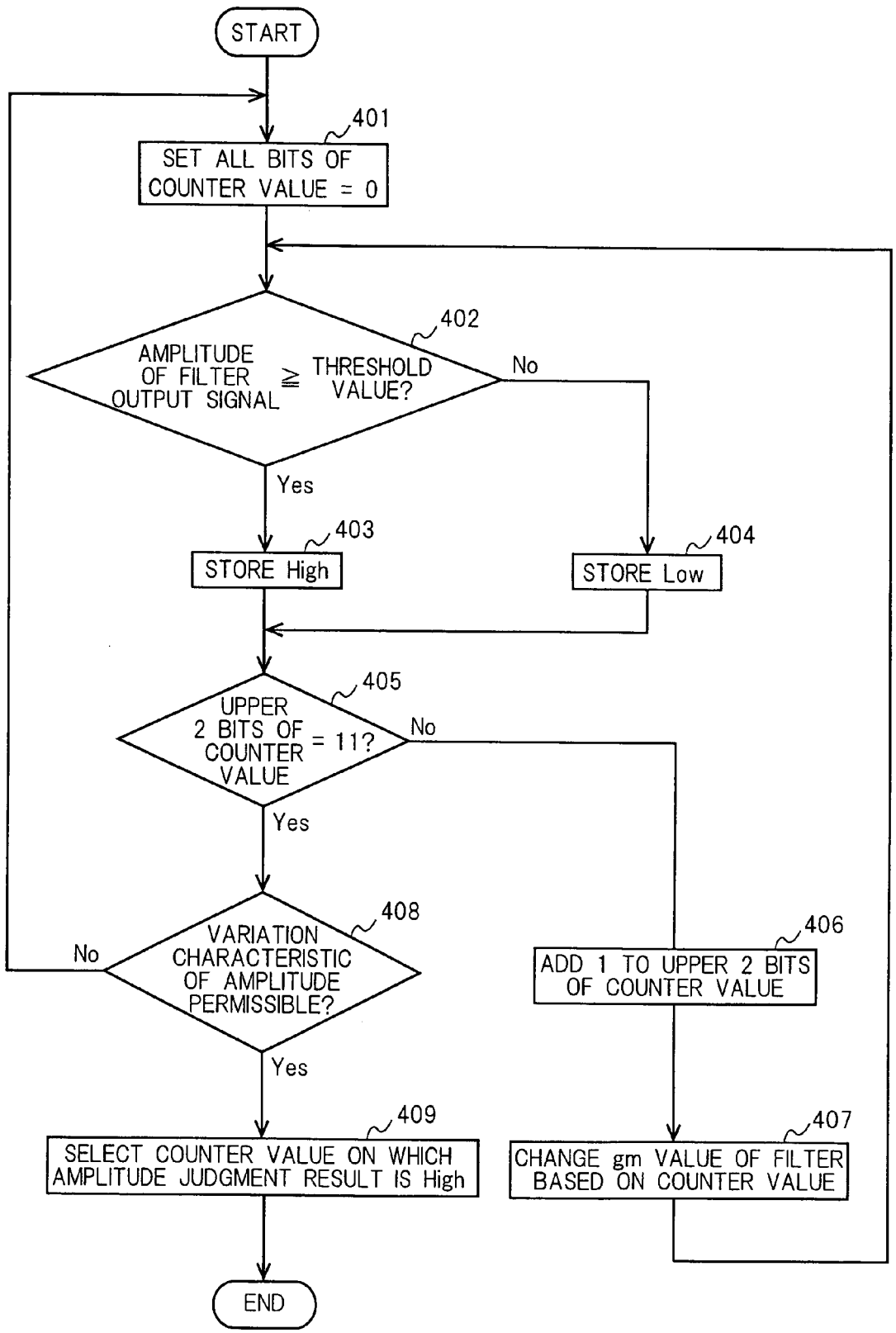
FIG. 4 is a flow chart of the coarse tuning step of an embodiment of the present invention.

FIG. 4 is a flow chart of the coarse tuning step of the filter 100 to be executed based on the amplitude of the filter output signal. The flow chart of the coarse tuning step of the filter 100 shown in FIG. 4 is described. In the coarse tuning step, the control part 102 specifies the counter value tentatively based on the amplitude of the filter output signal.

First, all of bits (6 bits) of the counter value of the updown counter 118 are set to be 0. The control part 102 inputs a counter value of 000000B to the control signal input terminal of the filter 100 as the control signal (Step 401).

Inputting the reference signal outputted from the reference signal generator 104 to the filter 100, the filter output signal is inputted into the amplitude detection part 101. The amplitude detection part 101 judges whether the amplitude of the filter output signal exceeds a predetermined threshold value or not (Step 402).

The amplitude detection part 101 outputs the amplitude judgment result of High if the amplitude of the filter output signal exceeds a predetermined threshold value. The amplitude judgment logic circuit 117 stores a High signal (Step 403).

The amplitude detection part 101 outputs a Low signal if the amplitude of the filter output signal is smaller than a predetermined threshold value. The amplitude judgment logic circuit 117 stores the Low signal (Step 404).

Whether the upper 2 bits of the counter value of the updown counter 118 are 11 or not is judged (Step 405).

If the upper 2 bits are not 11, 1 is added to the upper 2 bit of the counter value (Step 406).

The control part 102 inputs a new counter value to the control signal input terminal of the filter 100 as the control signal. The filter tuning part 105 changes the conductance gm of the filter 100 based on the counter value (Step 407).

After the time period necessary for the output signal of the filter to be settled down lapsed, steps return to Step 402 and the amplitude detection part 101 executes the amplitude judgment again.

In Step 405, if the upper 2 bits of the counter value are 11, steps proceeds to Step 408. The amplitude judgment logic circuit 117 judges whether, from four amplitude judgment results when the upper 2 bits of the counter value (the control signal) were changed from 00 to 11, the variation characteristic of the amplitude having four counter values as its parameter value is permissible or not (Step 408).

When it was judged to be not permissible, steps return to Step 401, and Step 401 and thereafter of the coarse tuning step are executed again.

Instead of the above, it is also possible that, when it was judged to be not permissible, the amplitude judgment logic circuit 117 outputs an error information and the tuning of the filter is stopped. In this case, holding the counter value (the value of the control signal) determined in the preceding filter tuning, the control part 102 outputs this counter value in the first mode. Step 408 will be explained in detail later.

If the variation characteristic of the amplitude is permissible, the control part 102 compares four amplitude judgment results and a counter value on which the judgment result is High is determined tentatively as the optimum value (Step 409). The coarse tuning step is terminated.

Figure 5:
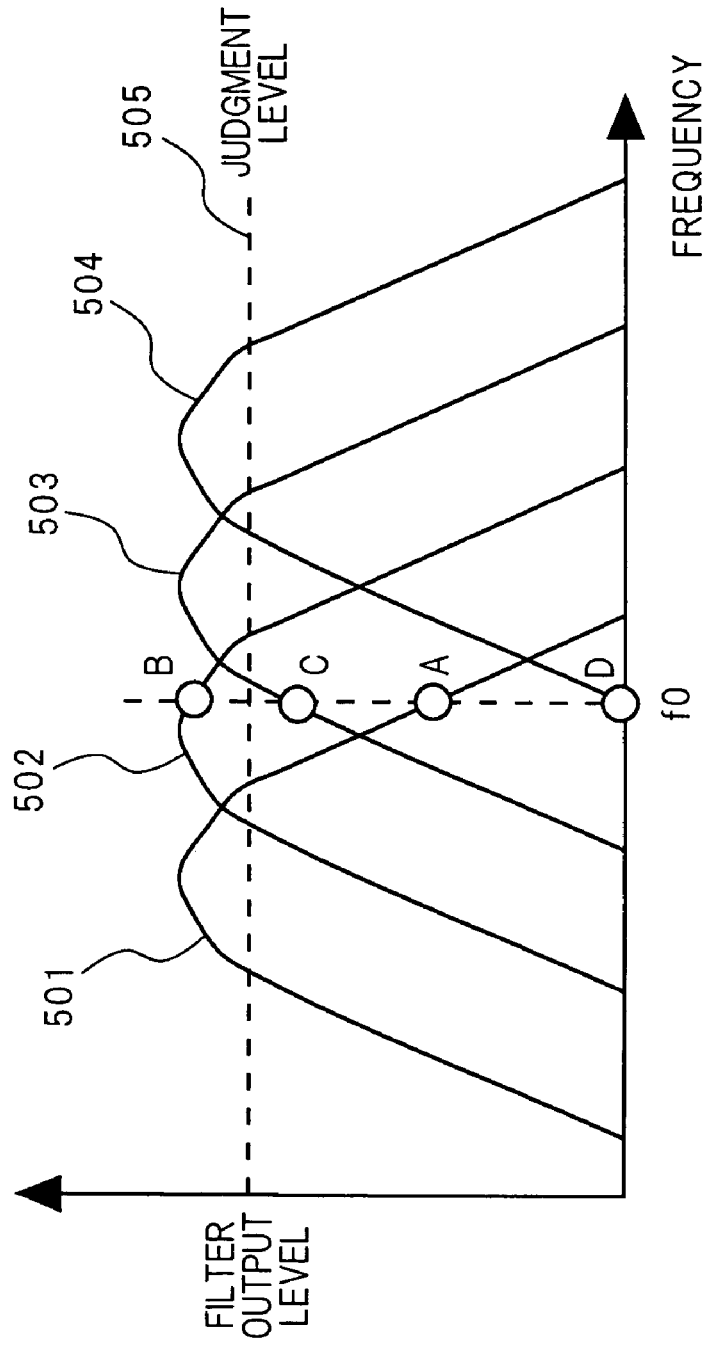
FIG. 5 is a drawing showing an example of frequency characteristic of a filter when the counter value is changed in the coarse tuning step.

FIG. 5 is a drawing showing the change of the frequency characteristic of the filter 100 in the case of changing the upper 2 bits of the counter value of the updown counter 118 from 00 to 11 successively (setting lower 4 bits to be 0000).

In FIG. 5, the abscissa shows the frequency and the ordinate shows the amplitude of the output signal. 501, 502, 503 and 504 show the characteristics of the filter 100 when inputting the control signal whose upper 2 bits are respectively 00, 01, 10, 11 (setting lower 4 bits to be 0000).

A, B, C and D show the amplitudes of the filter output signals in the case when inputting the control signals whose upper 2 bits are 00, 01, 10 and 11, respectively (lower 4 bits are 0000), to the filter 100, while inputting a reference signal of a frequency f0 to the filter 100.

A threshold value 505 shows the voltage outputted from the reference dc voltage generation part 306 (shown as the one having no hysteresis for the easiness of explanation).

If the amplitudes A, B, C or D of the filter output signal are larger than the predetermined threshold value 505 (judgment level), the amplitude detection part 101 outputs the amplitude judgment result of High, and if it is not, it outputs the amplitude judgment result of Low.

In FIG. 5, when the counter value is 000000B, the amplitude level of the filter output signal is A. Since the amplitude A is lower than the threshold value 505 (judgment level), the amplitude detection part 101 outputs the amplitude judgment result of Low. The amplitude judgment logic circuit 117 stores the amplitude judgment result of Low when the counter value is 000000B.

When the judgment at this counter value ends, the amplitude judgment logic circuit 117 changes the updown counter 118 to 010000B. From FIG. 5, the amplitude level of the filter output signal is B when the counter value is 010000B.

Since the amplitude B is larger than the threshold value 505 (judgment level), the amplitude detection part 101 outputs the amplitude judgment result of High. The amplitude judgment logic circuit 117 stores the amplitude judgment result of High when the counter value is 010000B.

The counter value of the updown counter 118 is changed to a next value of 100000B. The amplitude level of the filter output signal at the time when the counter value is 100000B is C.

Since the amplitude C is lower than the threshold value 505 (judgment level), at the time of this counter value, the amplitude judgment logic circuit 117 stores the amplitude judgment result of Low.

Finally, setting the counter value to be 11000B, the amplitude judgment is executed. The amplitude level of the filter output signal at the time when the counter value is 11000B is D.

Since the amplitude D is lower than the threshold value 505 (judgment level), at the time of this counter value, the amplitude judgment logic circuit 117 stores the amplitude judgment result of Low.

FIG. 6 is a drawing showing the value of the control signal (the counter value of the updown counter 118) that the amplitude judgment logic circuit 117 stores at the time when the coarse tuning step completes and the amplitude judgment result (the output signal of the amplitude detection part 101) at the value of respective control signals.

Only when the counter value is 010000B, the amplitude judgment result becomes a High signal. In the embodiment shown in FIG. 5 and FIG. 6, the counter value 010000B is tentatively specified as the optimum value (See FIG. 6).

Figure 7:
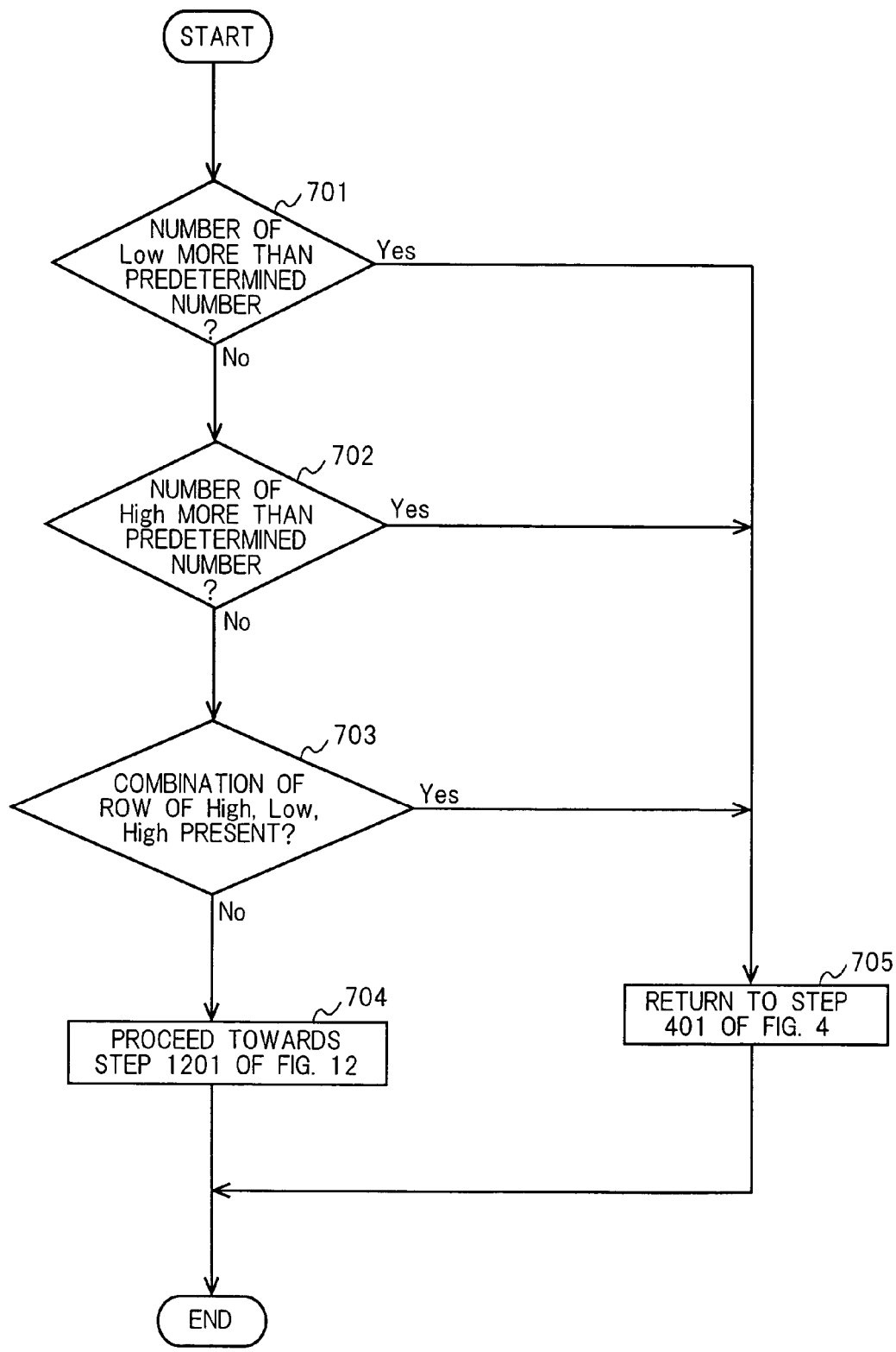
FIG. 7 is a flow chart showing a method that judges right or wrong of the result of the coarse tuning step of an embodiment of the present invention.

FIG. 7 is a flow chart showing the manner (details of Step 408) of judging right or wrong of the result of the coarse tuning step. At Step 408, the amplitude judgment logic circuit 117 judges whether the characteristic of the amplitude change, which has four counter values as its parameter, from four amplitude judgment results by changing upper 2 bits of the counter value (control signal) from 00 to 11, is permissible or not.

In FIG. 7, at first, the amplitude judgment logic circuit 117 judges whether the number of Low contained in four amplitude judgment results is P or more than P (in the embodiment, P=4 (number of all)) or not (Step 701). If the number of Low is P or more than P, it is judged to be an error. Returning to Step 401 of FIG. 4 and the coarse tuning step is repeated (Step 705).

If the number of Low is less than P, then it is judged whether the number of High contained in four amplitude judgment results is R or more than R (in the embodiment, R=2) or not (Step 702).

If the number of High is R or more than R, it is judged to be an error. Steps return to Step 401 of FIG. 4 and the coarse tuning step is repeated (Step 705).

If the number of High is less than R, it is judged whether a combination of a row of High, Low, High is present or not (Step 703).

If there is a combination of the row of High, Low, High, (that is, if two maximums exist), it is judge to be an error. Returning to Step 401 of FIG. 4 and the coarse tuning step is repeated (Step 705).

If there is no combination of the row of High, Low, High, steps proceed towards Step 1201 of FIG. 12 and the fine tuning step is executed.

If, for example, there is a relation between the counter value and the filter output signal as shown in FIG. 5, in the coarse tuning step of FIG. 4, it never occurs that the amplitude judgment result (the output signal of the amplitude detection part 101) comes out in an order of High, Low, High.

When the threshold value 505 (judgment level) is set appropriately, it never occurs that, in four amplitude judgment results, P or more than P becomes Low, or R or more than R becomes High. In the case that P or more than P becomes Low, or R or more than R becomes High, it is considered that the setting of the threshold value 505 (judgment level) shifts from an appropriate value in some reasons. Or, it is considered that there is such a cause that the filter tuning part 105 is not working well.

The amplitude judgment logic circuit 117 inspects the row of High and Low of the amplitude judgment result which was obtained by arranging them in the order of the counter values. If the row of High and Low is not permissible (if not normal), executing the coarse tuning step again and/or indicating an error, the filter tuning is ended.

By the above, when the amplitude detection part 101, the filter tuning part 105, and so on are not normally operating in some reasons, the coarse tuning step (tuning which is based on the amplitude of the filter output signal) can be executed correctly. Or, it is possible to prevent of introducing a wrong counter value and filter's malfunctioning in the first mode.

In the embodiment, after getting the amplitude judgment result of the amplitude detection part 101 on all values (four values) of upper 2 bits, the amplitude judgment logic circuit 117 judges right or wrong of four amplitude judgment results, and determined a most suitable counter value tentatively.

Instead of the above, it is also possible that the amplitude judgment logic circuit 117 judges all the time the success or failure of the row of the amplitude judgment result during the coarse tuning step of FIG. 4. By doing this, the coarse tuning can be executed at a higher speed.

For example, when the amplitude judgment result of the amplitude detection part 101 on all values (four values) of upper 2 bits is obtained, the threshold value 505 (judgment level) is determined so as to make only one amplitude judgment result High.

In the coarse tuning step of FIG. 4, if the amplitude judgment result of the amplitude detection part 101 is High at the time when the counter value is 000000B, and if the amplitude judgment result is High also at the time when the counter value is 010000B, the amplitude judgment logic circuit 117 judges it to be an error at this stage. The control part 102 executes the coarse tuning step again, or terminates the filter tuning.

To make the judgment all the time on the success or failure of the row of the amplitude judgment result during the coarse tuning step as has been described above is particularly effective in the case that the number of the counter values successively outputted from the control part 102 in the coarse tuning step is further many. For example, it is effective when demanding the amplitude judgment result of the amplitude detection part 101 on all the values (four values) of upper S bits ($S \geq 3$). The processing can be speeded up.

In the example cited in FIG. 4 to FIG. 6, it was started from a state that all the bits of the counter value were 0 in the coarse tuning step (step 401 of FIG. 4). In spite of appearing of High in the amplitude judgment result in this example when the counter was 010000B during the processing, the counter value of the updown counter was increased continuously and the amplitude detection was continued.

Instead of the above, it is also possible to end the coarse tuning step with the counter value at that time when the amplitude judgment result of High comes out once in the coarse tuning step. After that, it is possible to proceed to the fine tuning step based on the phase comparison.

Or, taking it into account that a possible dispersion caused in the manufacturing process exists, it is also possible to start the coarse tuning step by taking a counter value at which the probability that the amplitude judgment result is likely to become High as its initial value. It is also possible to end the coarse tuning step based on the amplitude detection at the time when the amplitude judgment result becomes High.

With any method, the coarse tuning step by the amplitude detection can be ended in a shorter time than in the embodiment.

On the other hand, in the embodiment (FIG. 4), although the amplitude judgment result became High during the process, the counter values of all the values with the upper 2 bits from 000000 to 110000 were inputted into the filter 100 as control signals. In Embodiment 4, the amplitude of the filter output signal on each control signal was detected. According to this method, the tuning time becomes longer than in other methods described above, but the probability of incorrect tuning can be made low.

In order to avoid a possible false determination of the most suitable counter value by the control part 102 even if the amplitude detection part 101 outputs a false amplitude judgment result in some cause, repeating the amplitude judgment with one counter value several times and if the same result repeatedly obtained N times, the result thus obtained may be maintained.

It is also possible, repeating the coarse tuning step N times, to determine either of the mode, the median, or the average value of the most suitable counter values obtained by each tuning step as the tentative counter value.

The fine tuning step of the filter 100 is explained. As has been described above, when the filter 100 is adjusted appropriately in the embodiment, the phase difference between two signals 130 and 131 is 0.

When the filter is lower than the target characteristic frequency (frequency of the reference signal), the phase of the filter output signal leads ahead the reference signal. When the filter is higher than the target characteristic frequency (frequency of the reference signal), the phase of the filter output signal lags behind the reference signal.

Utilizing this principle, in the fine tuning step, the control part 102 determines a counter value based on the phase difference between the filter output signal and the reference signal, and the fine tuning of the characteristic frequency is carried out.

Figure 8:
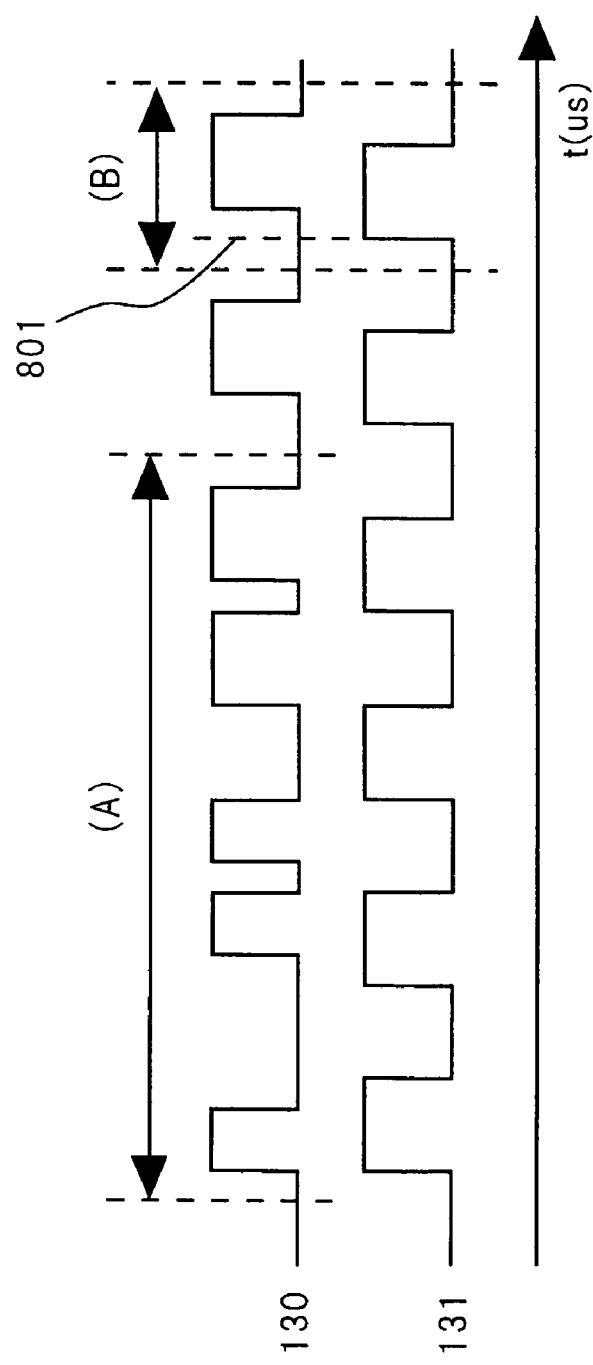
FIG. 8 is a time chart showing an output signal of binarized filter and a binarized reference signal.

FIG. 8 is the time chart showing the output signal (binarized filter output signal) 130 of the amplifier 106 and the output signal (binarized reference signal) 131 of the amplifier 107.

In FIG. 8, a section A shows a specified section after the control part 102 inputs a new control signal to the filter 100. In the specified section A, the phase of the binarized filter output signal 130 is not stable due to the influence such as the absolute group delay of the filter 100.

In the embodiment, a necessary time period before the filter output signal becomes stabilized after the control part 102 inputs a new control signal to the filter 100 is about 40 is. After the filter output signal becomes stable, the phase comparator part 103 judges the phase difference between two signals in a section B.

The phase comparator part 103, which is a D flip-flop, latches a binarized value of the filter output signal 130 at the rising edge 801 of the binarized reference signal 131 inputted to the clock input terminal as shown in FIG. 8.

If the latched value is High, it is known that the phase of the filter output signal is leading ahead the phase of the input signal and that the characteristic frequency of the filter 100 is lower than the target characteristic frequency (referring to FIG. 15(*b*)).

Since the value latched in a section B of FIG. 8 is Low, it is known that phase of the filter output signal lags behind the phase of the input signal and that the characteristic frequency f0 of the filter 100 is higher than the target characteristic frequency.

As has been shown in FIG. 6, the counter value 010000B was determined tentatively as the optimal value in the coarse tuning step. However, even if the upper 2 bits of the counter value are determined to be 01 tentatively in the coarse tuning step of FIG. 4, upper 2 bits of the most appropriate counter value are not necessarily 01. This is explained using FIGS. 5, 9 to 11.

Figure 10:
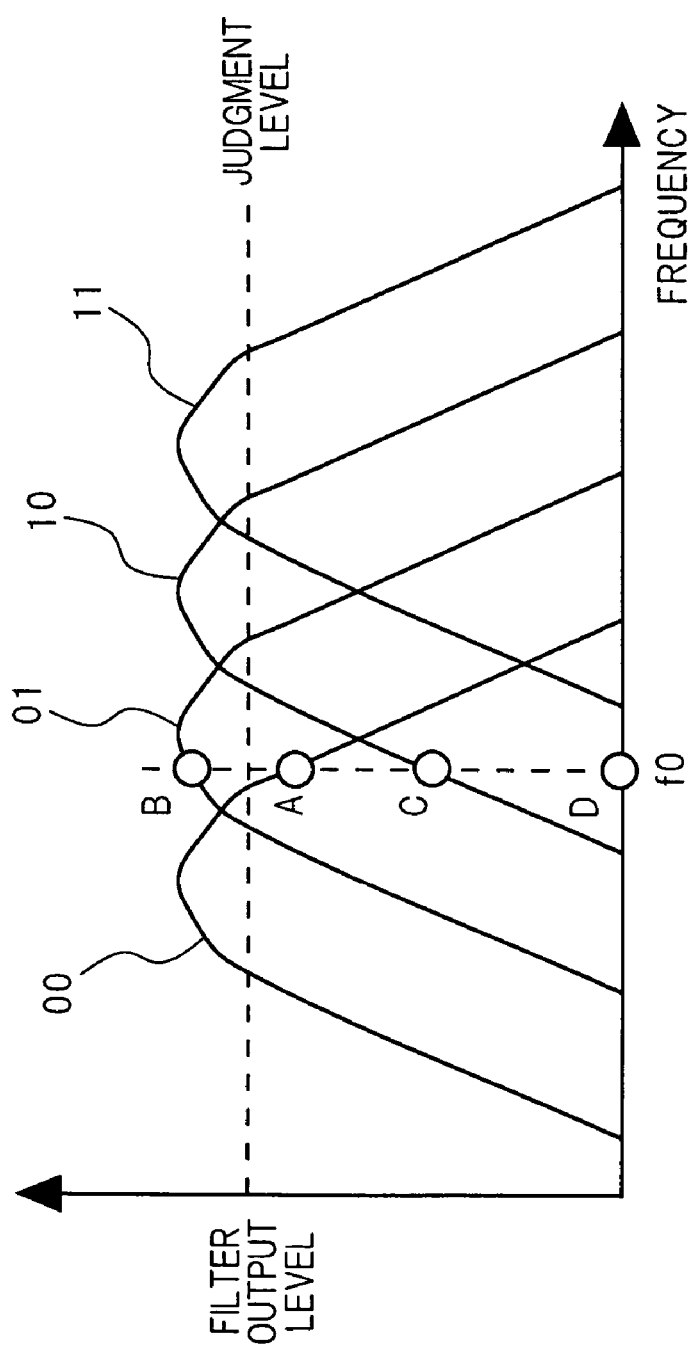
FIG. 10 is a drawing showing an example of frequency characteristic of other filter.

In the case of setting the lower 4 bits to be 0000 and increasing the upper 2 bits of the counter from 00 to 11 successively, the frequency characteristics of the filter 100 having the counter value as its control signal become as shown in FIG. 5 or FIG. 10. For either one of frequency characteristics shown in FIG. 5 and FIG. 10, a counter value of 010000B is specified tentatively in the coarse tuning step. The most appropriate counter value is higher than 010000B in FIG. 5 and is lower than 010000B in FIG. 10.

The result of the phase comparison outputted from the phase comparator part 103 when changing the counter value (control signal) in the vicinity of 010000B in the frequency characteristics of FIG. 5 and FIG. 10 are shown in FIG. 9 and FIG. 11, respectively. In FIG. 5 and FIG. 9, the most appropriate counter value is 010100B. In FIG. 10 and FIG. 11, the most appropriate counter value is 001100B. In the following fine tuning steps, the process is executed considering the above.

FIG. 12 and FIG. 13 are the flow charts of the fine tuning steps of the filter 100 to be executed based on the phase of the filter output signal. The process is executed in order from FIG. 12 to FIG. 13. First, the flow chart of the fine tuning step of the filter 100 shown in FIG. 12 is described. In the flow chart of FIG. 12, the counter value of upper 3 bits is determined.

First, the counter value is set to a value of 010000B determined tentatively by the coarse tuning step based on the amplitude of the filter output signal. After a specified waiting time that is sufficiently longer than the absolute group delay time of the filter, (for example, time equal of 40 is or longer than it) passes, the phase comparator part 103 judges whether the characteristic frequency of the filter is higher than the target frequency or not (judging a phase difference) (Step 1201).

If the characteristic frequency of the filter is higher than the target frequency, −1 is made at the third bit from the uppermost bit of the counter value (counter value=counter value −001000B) (Step 1202).

The control part 102 inputs a new counter value to the filter 100 as the control signal. The filter tuning part 105 changes the conductance gm of the filter 100 (Step 1203).

After the specified waiting time lapsed, the phase comparator part 103 judges whether the filter characteristic frequency is equal to or less than the target frequency or not (Step 1204).

If the characteristic frequency of the filter is equal to or less than the target frequency, upper 3 bits of the counter value at that time are determined as the counter value to be used in the first mode (Step 1209).

The process of FIG. 12 is terminated. If the characteristic frequency of the filter is higher than the target frequency in Step 1204, the process returns to Step 1202.

In Step 1201, if the characteristic frequency of the filter is equal to or less than the target, 1 is added to the third bit of the counter value (counter value=counter value+001000B) (Step 1205).

The control part 102 inputs a new counter value to the filter 100 as the control signal. The filter tuning part 105 changes the conductance gm of the filter 100 (Step 1206).

After a specified waiting time lapsed, the phase comparator part 103 judges whether the filter characteristic frequency is higher than the target frequency or not (Step 1207).

If the filter characteristic frequency is higher than the target frequency, −1 is made at the third bit from the uppermost bit of the counter value (counter value=counter value−001000B) (Step 1208).

The upper 3 bits of the calculated counter value is determined as a counter value to be used in the first mode (Step 1209).

The process of FIG. 12 is terminated. If the filter characteristic frequency is equal to or less than the target frequency in Step 1207, the process returns to Step 1205.

The reference signal outputted from the reference signal generator 104 is inputted to the filter 100. The amplitude detection part 101 outputs the amplitude judgment result based on the filter output signal. The amplitude judgment result is inputted to the amplitude judgment logic circuit 117 and stored in it.

The amplitude judgment logic circuit 117 changes the counter value of the updown counter 118. After the gm value of the filter 100 is changed and a predetermined waiting time lapsed, the above processing is repeated and the amplitude judgment logic circuit 117 stores an amplitude judgment result.

By repeating the processing loop of the fine tuning steps of FIG. 12 several times, even if a counter value which largely shifted from the correct counter value is determined tentatively in the coarse tuning step, the correct counter value can be sought. In the flow chart of FIG. 12, a correct upper 3 bits value can be sought.

In FIG. 12, when the number of repetition of the processing loop exceeds a specified threshold, it is possible to output information that the counter value determined in the coarse tuning step is an error. Or it is also possible to repeat the coarse tuning step of FIG. 4.

By ascertaining again in the fine tuning step as described above that the counter value determined in the coarse tuning step is correct, the reliability of the determined upper bits can be raised.

The process proceeds to the next adjustment of lower bits. By the adjustment only for the upper 3 bits by the algorithm of FIG. 4 and FIG. 12, the accuracy of the characteristic frequency with respect to the target frequency of the filter is not sufficient.

FIG. 13 is a flow chart showing the method of determining the lower bits from the fourth bit of the counter value. In FIG. 13, the fourth bit to the sixth bit from the uppermost bit are determined.

At the beginning of the processing of FIG. 13, upper 3 bits of the value of the updown counter 118 are the value which was determined by the processing of FIG. 12, and from the fourth bit to the sixth bit from the uppermost bit are 000B.

First, 4 is set for the initial value i (Step 1301).

The i-th bit from the uppermost bit of the counter value is set to be 1 (Step 1302).

The control part 102 inputs a new counter value to the filter 100 as the control signal. The filter tuning part 105 changes the conductance gm of the filter 100 (Step 1303).

After a specified waiting time necessary for the stabilization of the phase lapsed, the phase comparator part 103 judges the phase difference. The phase comparator part 103 judges whether the characteristic frequency of the filter is higher than the target frequency or not (Step 1304).

By setting the i-th bit to be 1, if the characteristic frequency of the filter is higher than the target frequency, the i-th bit is returned to 0 (Step 1305).

If the characteristic frequency of the filter is equal to or less than the target frequency in Step 1304, the i-th bit is determined to 1.

Next, it is judged whether i is smaller than the number of digits (being 6 in the embodiment) of the updown counter 118 or not (Step 1306).

If i is the value smaller than the number of digits (being 6 in the embodiment) of updown counter 118, incrementing i (step 1307) and process returns to step 1302. Hereinafter, similar processing is repeated on the 5th bit and the 6th bit from the uppermost bit of the counter value.

If i is the same as the number of digits of the counter (if being a least significant bit), the present counter value is determined as the counter value to be used in the first mode (Step 1308).

The processing is terminated. Determining successively in an order from the upper bit down to the least significant bit as described and at the time when the value of the least significant bit is determined, the tuning is terminated.

Figure 14:
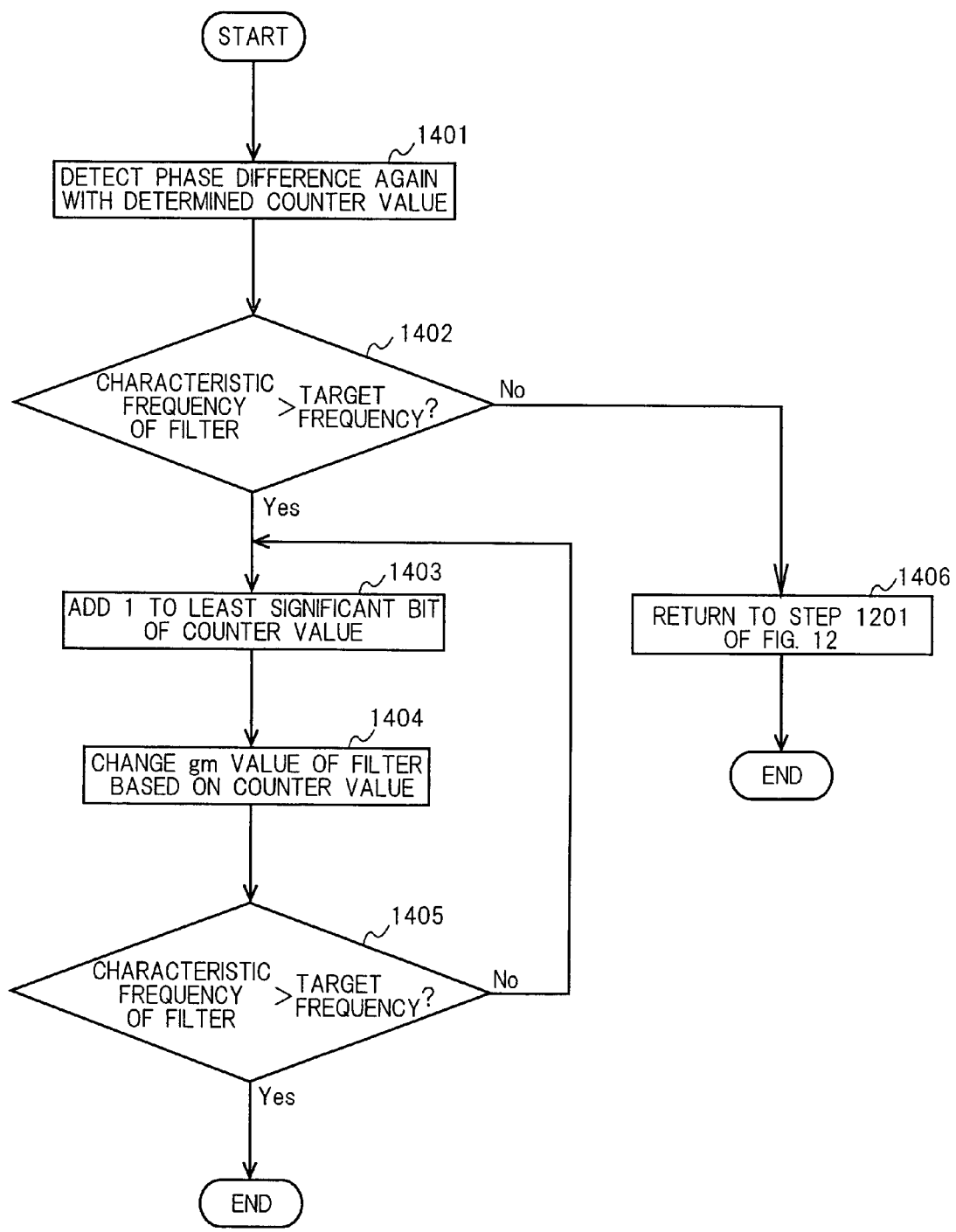
FIG. 14 is a flow chart of the confirmation step of an embodiment of the present invention.

After the fine tuning step is ended, finally the confirmation step is executed. FIG. 14 is a drawing showing a flow chart of the confirmation step by the phase comparison.

In FIG. 14, at first, setting the counter value determined finally in the fine tuning step of FIG. 13 to be the control signal, the phase comparator part 103 judges the phase difference (Step 1401).

It is judged whether the characteristic frequency of the filter is equal to or less than the target frequency or not (Step 1402).

If the characteristic frequency of the filter is higher than the target frequency, returning to Step 1201 of FIG. 12 and the fine tuning step is processed again (Step 1406).

When confirming that the characteristic frequency of the filter is equal to or less than the target frequency in Step 1402, 1 is added to the least significant bit of the counter value finally determined (Step 1403).

The control part 102 inputs a new counter value to the filter 100 as the control signal. The filter tuning part 105 changes the conductance gm of the filter 100 (Step 1404).

It is judged whether the characteristic frequency of the filter is higher than the target frequency or not (Step 1405).

If confirming that the characteristic frequency of the filter is higher than the target frequency value, the process is terminated with assuming that the determined counter value is correct. If the characteristic frequency of the filter is equal to or less than the target frequency value in Step 1405, returning to Step 1403, and the above-mentioned process is repeated.

In the confirmation step of FIG. 14, by taking the waiting time, which is necessary for the stabilization of the phase of the filter output signal after the control signal is updated, somewhat longer, the confirmation with a high accuracy than by the phase comparison in the fine tuning step.

In order to avoid a possible false determination of the most suitable counter value by the control part 102 even if the phase comparator part 103 outputs a false phase judgment result in some cause, repeating the phase judgment with one counter value several times and if the same result repeatedly obtained N times, the result thus obtained may be maintained.

It is also possible, repeating the fine tuning step N times, to determine either of the mode, the median, or the average value of the most suitable counter values obtained by each fine tuning step as the final most suitable counter value.

The largest one among the factors responsible for the deviation of the characteristic frequency of the gm-C filter is dispersion due to the manufacturing process of integrated circuits including it. The next large factor is the fluctuation of the characteristic frequency caused by temperature variations and power source changes.

In the filter tuning processed first time after the manufacturing of the integrated circuit including the automatic tuning apparatus for filter of the present invention, it is possible that, executing the filter tuning with a sufficient time in the method shown in the embodiment, the counter value obtained by the tuning result is written into a nonvolatile memory inside. With this, it is possible to compensate for the dispersions caused in the manufacturing process of the integrated circuit. At the time when conducting the next tuning, the counter value written in the filter tuning is read out from the nonvolatile memory.

For example, it is also possible to determine the value of a plural number of control signals which are inputted in the control terminal from the control part 120 in the coarse tuning step to be a value in the vicinity of the present counter value. In the early stages of the coarse tuning step, the amplitude judgment result of High can be obtained with a high probability. Without executing the coarse tuning step up to the last stage, it is possible to determine a counter value obtained at that time as the tentative value and to proceed to the next fine tuning step. The filter tuning time can be shortened.

It is also possible to skip the coarse tuning step and take the counter value which was read from the nonvolatile memory as the tentative counter value, and to execute the filter tuning from the fine tuning step by the phase comparison. With this, it is possible to shorten the filter tuning time at and after the second time.

In the filter tuning at and after the second time, by shutting off a power source of the amplitude detection part and the amplitude judgment logic circuit, further lower power consumption can be attempted. With this, the filter automatic tuning can be executed more efficiently.

The control part 102 compares the counter value (counter value in the preceding time) which was determined by the tuning of the filter in the last time and was stored in a nonvolatile memory with the counter value (counter value which was newly obtained) which was determined by the tuning of the filter newly executed.

If the difference between the counter value in the preceding time and the counter value newly obtained is more than the specified threshold value, it is possible to cancel the counter value newly obtained and to use the counter value lasting the preceding time just as it was in the first mode.

The tuning error can be detected by setting the threshold value with estimating how much the counter value deviates at maximum due to the influence of temperature variations and power source changes. When a tuning error is detected, it is possible to repeat the tuning.

It is also possible to provide a Q-value control terminal for changing the Q-value to the filter 100. The control part 102 controls the input signal of the Q-value control terminal to makes the Q-value high in the second mode. Inputting successively a plural number of control signals to the above-mentioned control terminal of the filter 100 having a high Q-value, the coarse tuning step and the fine tuning step are executed. Thereby it is possible to make the tuning accuracy high.

It is also possible to execute the coarse tuning step in a usual state in which the Q-value of the filter 100 is low, and thereafter to execute the fine tuning step with raising the Q-value high. When the Q-value is low, the coarse tuning by the amplitude detection is easier. When the Q-value is high, the fine tuning by the phase detection can be carried out with a higher accuracy.

Hereupon, in the above explanation, although a filter under the tuning process was assumed to be the gm-C filter, it is also possible to use any kind of electronic filter whose center frequency can be variably controlled by changing voltage or current.

In the above-mentioned embodiment, the filter was a BPF of the narrow band. However, it is not limited to the above, it is also possible to use an HPF or an LPF.

In the above-mentioned embodiment, the automatic tuning apparatus for filter was installed into the receiver part of a mobile phone. However, it is not limited to the above, it is also possible to install the automatic tuning apparatus for filter of the present invention into the receiver part of a communication instrument in a base station of the mobile phone, for example.

It is also good to install the automatic tuning apparatus for filter of the present invention into any communication instrument having a high-precision reference signal generator and a filter.

In these communication instruments, the automatic tuning apparatus for filter is operated in the first mode while the communication is conducted. When the communication is absent, the automatic tuning apparatus for filter is operated in the second mode at a specified timing. With this, a high reliability and a low power consumption capability can be realized.

As has been described above, according to the present invention, when executing the automatic filter tuning, after tuning a filter roughly by the amplitude detection, a filter is tuned with a high precision by the phase comparison. Consequently, even for such a filter with large dispersion due to its manufacturing process or also for a filter having a high Q-value, it is possible to execute the automatic filter tuning in a short time.

Since any reference filter for the filter tuning use is not required, it becomes a large merit for attaining the low power consumption.

The present invention is useful for the automatic tuning apparatus for filter and the communication instrument including it.

Although the description on the invention has been done with a certain degree of detail, the contents of present disclosure should be able to be changed in the detail of its configuration, and changes of the combination and the order of each element can be realized without deviating from the scope and the thought of the invention claimed.

The invention claimed is:
1. An automatic tuning apparatus for filter comprising:
an input terminal to which an input signal is inputted;
a reference signal generator for outputting a reference signal;
a first switching part wherethrough said input signal and said reference signal are inputted and wherefrom either one of them is selectively outputted;
a filter having a control terminal wherethrough a control signal for controlling its filter characteristic is inputted, said filter processing the signal outputted from said switching part with said filter characteristic and then outputting the processed signal;
an output terminal from which the output signal of said filter is outputted;
an amplitude detection part whereto said output signal of said filter is inputted and detects its amplitude;
a phase comparator part for detecting the phase difference between the signal before its passing through said filter and the signal after its passing through said filter; and
a control part which:
in a first mode, controls said first switching part such that said input signal is inputted to said filter and outputted from said output terminal; and
in a second mode, controls said first switching part so that said reference signal is inputted to said filter; inputs successively a plural number of control signals to said control terminal of said filter; determines tentatively the value of the control signal based on respective amplitudes detected by said amplitude detection part as coarse tuning step; inputs successively a plural number of control signals in the vicinity of the tentatively determined value to said control terminal; and determines the value of the control signal to be used in said first mode as fine tuning step based on respective phase differences detected by said phase comparator part,
wherein, in said second mode, said control part:
repeats said coarse tuning step a plurality of times and makes the mode, the median, or the average value obtained from a plural number of repeated results to be the value of the tentatively determined control signal; and/or repeats said fine tuning steps a plurality of times and makes the mode, the median, or the average value obtained from a plural number of repeated results to be the value of said control signal.

2. An automatic tuning apparatus for filter comprising:

an input terminal to which an input signal is inputted;

a reference signal generator for outputting a reference signal;

a first switching part wherethrough said input signal and said reference signal are inputted and wherefrom either one of them is selectively outputted;

a filter having a control terminal wherethrough a control signal for controlling its filter characteristic is inputted, said filter processing the signal outputted from said switching part with said filter characteristic and then outputting the processed signal;

an output terminal from which the output signal of said filter is outputted;

an amplitude detection part whereto said output signal of said filter is inputted and detects its amplitude;

a phase comparator part for detecting the phase difference between the signal before its passing through said filter and the signal after its passing through said filter; and a control part which:

in a first mode, controls said first switching part such that said input signal is inputted to said filter and outputted from said output terminal; and in a second mode, controls said first switching part so that said reference signal is inputted to said filter; inputs successively a plural number of control signals to said control terminal of said filter; determines tentatively the value of the control signal based on respective amplitudes detected by said amplitude detection part as coarse tuning step; inputs successively a plural number of control signals in the vicinity of the tentatively determined value to said control terminal; and determines the value of the control signal to be used in said first mode as fine tuning step based on respective phase difference detected by said phase comparator part, wherein, said control part has an updown counter of plural number of bits and inputs the counter value of the updown counter as the control signal to said control terminal of said filter;

the characteristic frequency of said filter changes to a definite direction as said counter value increases;

said control part executes said coarse tuning step by means of changing predetermined number of higher significant bits of the counter value of said updown counter and inputs a plural number of counter values which start from a value in the vicinity of the counter value tentatively determined in said coarse tuning step as the control signal to said control terminal, thereby to execute said fine tuning step.

3. An automatic tuning apparatus for filter according to claim 2 further comprising:

a first binarizer which receives said reference signal in a state before it is inputted into said filter, converts it into a binarized reference signal of duty factor of about 50 percent, and then sends it to said phase comparator part; and a second binarizer which receives the output signal of said filter, converts it into a binarized output signal and then sends it to said phase comparator part;

wherein, in said fine tuning step, said phase comparator part detects the phase difference between said binarized reference signal and said binarized output signal, said control part raises or lowers the counter value of said updown counter according to said phase difference.

4. An automatic tuning apparatus for filter according to claim 2 further characterized in that: in said coarse tuning step, said control part judges whether the amplitude variation characteristic having a plural number of counter values as parameter is permissible or not permissible; and when judged "not permissible", said control part executes said coarse tuning step again, or outputs error information thereby to stop the tuning of the filter.

5. An automatic tuning apparatus for filter according to claim 2 characterized in that:

said coarse tuning step is started, taking a certain value in the vicinity of a presently stored counter value as an initial value, or taking a certain value in the vicinity of a counter value derived from the presently stored counter value as an initial value based on a specified parameter value at the time when the presently stored counter value was stored as well as on the parameter value at the present, and said coarse tuning step is terminated at the time when a permissible amplitude variation characteristic including maximum or minimum point or range was obtained.

6. An automatic tuning apparatus for filter according to claim 2 further characterized in that:

after said fine tuning, said control part adds and/or subtracts a specified number of bits to and/or from the determined counter value and then inputs the obtained counter value to said control terminal;

said phase comparator part detects the phase difference;

when the phase difference is permitted, said determined counter value is maintained; and when the phase difference is not permitted, said determined counter value is cancelled.

7. An automatic tuning apparatus for filter according to claim 2 further characterized in that:

said filter has a Q-value control terminal wherethrough the Q-value is changed further;

in said second mode, said control part raises the Q-value by controlling the input signal to said Q-value control terminal, inputs a plural number of control signals successively to said control terminal of said filter, and determines a value of the control signal to be used in said first mode based on respective amplitudes detected by said amplitude detection part and respective phase differences detected by said phase comparator part.

8. An automatic tuning apparatus for filter according to claim 2 further characterized in that, in the case that the tuning of said filter is executed newly, based on the value of the control signal determined in the preceding tuning of the filter, said control part determines a plural number of values of the control signal to be inputted to said control terminal in said coarse tuning step, or in said coarse tuning step and said fine tuning step.

9. An automatic tuning apparatus for filter according to claim 2 characterized in that, when a difference between a first counter value determined by said preceding filter tuning and a second counter value determined by said filter tuning newly executed is larger than a specified threshold value, said control part cancels the second counter value, executes the tuning of the filter again, or uses the first counter value without any modification in said first mode.

10. A communication instrument characterized in that: it has an automatic tuning apparatus for filter according to claim 1 in its receiver part; when it executes communication, said automatic tuning apparatus for filter executes said first mode;

and when it does not execute communication, said automatic tuning apparatus for filter executes said second mode at specified timing.

11. The communication instrument according to claim 10 characterized in that the communication instrument is a mobile phone or its base-station communication instrument.

12. A communication instrument characterized in that: it has an automatic tuning apparatus for filter according to claim 2 in its receiver part; when it executes communication, said automatic tuning apparatus for filter executes said first mode; and when it does not execute communication, said automatic tuning apparatus for filter executes said second mode at specified timing.

13. The communication instrument according to claim 12 characterized in that the communication instrument is a mobile phone or its base-station communication instrument.

* * * * *